(12) United States Patent
Okamoto et al.

(10) Patent No.: US 9,497,856 B2
(45) Date of Patent: Nov. 15, 2016

(54) LAMINATED STRUCTURE, DRY FILM AND METHOD OF PRODUCING LAMINATED STRUCTURE

(71) Applicant: TAIYO INK MFG. CO., LTD., Hiki-gun (JP)

(72) Inventors: Daichi Okamoto, Higashimatsuyama (JP); Shoji Minegishi, Iruma (JP); Masao Arima, Kawagoe (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 0 days.

(21) Appl. No.: 13/853,161

(22) Filed: Mar. 29, 2013

(65) Prior Publication Data
US 2013/0256017 A1 Oct. 3, 2013

(30) Foreign Application Priority Data

Mar. 30, 2012 (JP) ................. 2012-083101

(51) Int. Cl.
| | |
|---|---|
| *B32B 15/00* | (2006.01) |
| *H05K 1/03* | (2006.01) |
| *B32B 27/08* | (2006.01) |
| *G03F 7/027* | (2006.01) |
| *B32B 27/26* | (2006.01) |
| *G03F 7/095* | (2006.01) |

(Continued)

(52) U.S. Cl.
CPC .............. *H05K 1/036* (2013.01); *B32B 27/08* (2013.01); *B32B 27/26* (2013.01); *G03F 7/027* (2013.01); *G03F 7/0955* (2013.01); *H05K 3/287* (2013.01); *G03F 7/032* (2013.01); *G03F 7/085* (2013.01); *H05K 3/285* (2013.01); *H05K 3/3452* (2013.01); *H05K 2201/0195* (2013.01); *Y10T 156/10* (2015.01)

(58) Field of Classification Search
USPC ......... 428/209, 901; 525/391, 104, 112, 119
See application file for complete search history.

(56) References Cited

U.S. PATENT DOCUMENTS

| | | | |
|---|---|---|---|
| 4,214,026 A * | 7/1980 | Ibata ...................... | B32B 15/08 156/244.17 |
| 4,404,356 A * | 9/1983 | Andrews ............ | C08G 59/4021 525/504 |

(Continued)

FOREIGN PATENT DOCUMENTS

| | | |
|---|---|---|
| CN | 1717428 | 1/2006 |
| CN | 101281367 | 10/2008 |

(Continued)

OTHER PUBLICATIONS

Chinese Office Action issued on Dec. 2, 2014, in CN 201310110170.0, filed Mar. 29, 2013 (with partial English translation).

*Primary Examiner* — Humera Sheikh
*Assistant Examiner* — Seth Dumbris
(74) *Attorney, Agent, or Firm* — Oblon, McClelland, Maier & Neustadt, L.L.P.

(57) ABSTRACT

A laminated structure including a base material and resin insulating layers formed on the base material. The resin insulating layers include a resin insulating layer (A) containing a curing accelerator composed of an N atom-containing basic compound such that the resin insulating layer (A) is in contact with the base material. The laminated structure includes a resin insulating layer (B) which contains a P atom-containing curing accelerator in addition to the resin insulating layer (A).

17 Claims, 1 Drawing Sheet

(51) Int. Cl.
*H05K 3/28* (2006.01)
*H05K 3/34* (2006.01)
*G03F 7/032* (2006.01)
*G03F 7/085* (2006.01)

(56) References Cited

U.S. PATENT DOCUMENTS

| | | | |
|---|---|---|---|
| 5,538,821 A * | 7/1996 | Kakinuma et al. | 430/18 |
| 5,948,514 A * | 9/1999 | Komori et al. | 428/209 |
| 6,794,031 B2 * | 9/2004 | Murakami | H05K 3/281 |
| | | | 428/355 EP |
| 6,835,785 B2 * | 12/2004 | Ishii et al. | 525/391 |
| 7,560,518 B2 * | 7/2009 | Ishii et al. | 525/391 |
| 8,541,508 B2 * | 9/2013 | Uchida et al. | 525/301 |
| 2011/0213058 A1 * | 9/2011 | Yano | C08G 18/4854 |
| | | | 524/115 |

FOREIGN PATENT DOCUMENTS

| | | | |
|---|---|---|---|
| CN | 102006717 | 4/2011 | |
| JP | 61-243869 | 10/1986 | |
| JP | 2005-002294 A | 1/2005 | |
| JP | 2009-031344 A | 2/2009 | |
| WO | WO 01/72857 A1 | 10/2001 | |
| WO | WO 2007/032424 A1 | 3/2007 | |
| WO | WO2010035820 * | 1/2010 | C09J 201/10 |

* cited by examiner

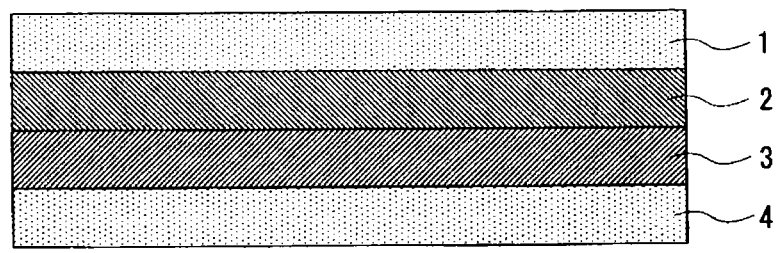

LAMINATED STRUCTURE, DRY FILM AND METHOD OF PRODUCING LAMINATED STRUCTURE

TECHNICAL FIELD

The present invention relates to a laminated structure and a dry film that are useful in the production of a printed circuit board or the like; and a method of producing the laminated film. More particularly, the present invention relates to a laminated structure comprising resin insulating layers which exhibits excellent adhesion to a base material and has excellent insulation reliability; and a dry film used for producing the laminated structure.

BACKGROUND ART

In recent years, in response to high densification of printed circuit boards associated with compactization of electronic appliances, there is an increasing demand for high workability and high performance also in a curable resin composition for a resin insulating layer such as solder resist. For example, in accordance with miniaturization, weight reduction and performance improvement of electronic appliances, semiconductor packages have been also miniaturized and provided with a greater number of pins and such semiconductor packages are increasingly mass-produced. In response to such high densification, IC packages called "BGA" (ball grid array), "CSP" (chip scale package) and the like have emerged to replace those IC packages called "QFP" (quad flat-pack package), "SOP" (small outline package) and the like. As a solder resist to be used in such package substrate or a printed circuit board for vehicles where excellent heat resistance is required, a variety of curable resin compositions have been proposed so far (see, for example, Patent Document 1).

In a printed circuit board equipped with fine-pitched circuit patterns such as a package substrate, since the circuit patterns are densely formed close to each other, shortage, cross-talk noise and the like are highly likely to occur between the lines of the circuit patterns.

In addition, as electronic control of automobiles, particularly driving members thereof, has been progressively advanced, there are more cases where a printed circuit board is installed in a place where the ambient temperature is high, such as engine room or its vicinity. Thus, depending on the place of installation, a printed circuit board used in a vehicle is exposed to a high temperature environment of 80° C. to 150° C. over a prolonged period of time.

Therefore, a high-performance solder resist to be used in such package substrate or printed circuit board for vehicles is required to have high insulation reliability.

Meanwhile, prior to the formation of a resin insulating layer such as a solder resist, a pre-treatment is usually performed to roughen the substrate surface. The method of such substrate pre-treatment has been diversified in accordance with the application thereof and a strong roughening treatment may not be necessarily performed, so that sufficient anchoring effect cannot be expected to be attained in some cases. Therefore, a resin insulating layer is required to exhibit sufficient adhesion to a substrate regardless of the type of the pre-treatment.

RELATED ART DOCUMENTS

Patent Documents

[Patent Document 1] Japanese Unexamined Patent Application Publication No. S61-243869 (Claims)

SUMMARY OF THE INVENTION

Problems to be Solved by the Invention

However, it is becoming difficult to satisfy the ever-increasing demand for high insulation reliability in a resin insulating layer of solder resist or the like and ensure the adhesiveness to a base material at the same time; therefore, a further research and development is required.

In view of the above-described circumstances, an object of the present invention is to provide a laminated structure comprising resin insulating layers which exhibits excellent adhesion to a base material and has excellent insulation reliability; a dry film used for the production of the laminated structure; and a method of producing the laminated structure.

Means for Solving the Problems

The present inventors intensively studied in order to solve the above-described problems and discovered that the above-described problems can be solved by, in a laminated structure which comprises a base material and a plurality of resin insulating layers formed thereon, arranging a resin insulating layer (A) which contains a curing accelerator composed of an N atom-containing basic compound as a layer in contact with the base material and incorporating at least one resin insulating layer (B) which contains a P atom-containing curing accelerator, thereby completing the present invention.

That is, the laminated structure according to the present invention is a laminated structure comprising a base material and a plurality of resin insulating layers formed thereon, which is characterized in that a layer of the above-described plurality of resin insulating layers, which is in contact with the base material, is a resin insulating layer (A) which contains a curing accelerator composed of an N atom-containing basic compound; and that the laminated structure has, in addition to the resin insulating layer (A) which contains a curing accelerator composed of an N atom-containing basic compound, at least one resin insulating layer (B) which contains a P atom-containing curing accelerator.

In the laminated structure according to the present invention, it is preferred that the surface layer of the above-described plurality of resin insulating layers be a resin insulating layer (B) which contains a P atom-containing curing accelerator.

Further, in the laminated structure according to the present invention, it is preferred that the above-described base material be a printed circuit board on which a conductor circuit layer has been formed in advance and that the above-described resin insulating layers constitute a solder resist.

Further, in the laminated structure according to the present invention, it is preferred that the above-described plurality of resin insulating layers consist of the above-described resin insulating layer (A) which contains a curing accelerator composed of an N atom-containing basic compound and the above-described resin insulating layer (B) which contains a P atom-containing curing accelerator.

Further, in the laminated structure according to the present invention, it is preferred that the above-described P atom-containing curing accelerator contain a quaternary phosphonium salt.

The dry film according to the present invention is a dry film to be used for the production of any one of the above-described laminated structures, which is characterized in that the dry film comprises a film and a plurality of curable resin layers formed thereon; that, among the above-described plurality of curable resin layers, a layer in contact with the film or the outermost layer is a curable resin layer (A') which contains a curing accelerator composed of an N atom-containing basic compound; and that the dry film has a curable resin layer (B') which contains a P atom-containing curing accelerator in addition to the curable resin layer (A') which contains a curing accelerator composed of an N atom-containing basic compound.

The method of producing a laminated structure according to the present invention is characterized by comprising the step of laminating the above-described dry film on a base material such that the above-described curable resin layer (A') comes into contact with the surface of the base material.

EFFECTS OF THE INVENTION

By the present invention, it becomes possible to provide a laminated structure comprising resin insulating layers which exhibits excellent adhesion to a base material and has excellent insulation reliability; and a dry film used for the production of the laminated structure.

BRIEF DESCRIPTION OF THE DRAWINGS

FIG. 1 is a cross-sectional view which schematically shows a preferred embodiment of the dry film according to the present invention.

MODE FOR CARRYING OUT THE INVENTION

The laminated structure according to the present invention is a laminated structure comprising a base material and a plurality of resin insulating layers formed thereon, which is characterized in that a layer of the above-described plurality of resin insulating layers, which is in contact with the base material, is a resin insulating layer (A) which contains a curing accelerator composed of an N atom-containing basic compound; and that the laminated structure has, in addition to the resin insulating layer (A) which contains a curing accelerator composed of an N atom-containing basic compound, at least one resin insulating layer (B) which contains a P atom-containing curing accelerator. Preferably, among the plurality of resin insulating layers, the surface layer, that is, the outermost layer is a resin insulating layer (B) which contains a P atom-containing curing accelerator.

A curable resin composition used to form the resin insulating layer (A) which contains a curing accelerator composed of an N atom-containing basic compound and the resin insulating layer (B) which contains a P atom-containing curing accelerator may be either a thermosetting resin composition or a photosensitive resin composition; however, it is preferably a photosensitive resin composition.

In the curable resin composition for forming the resin insulating layer (A) which contains a curing accelerator composed of an N atom-containing basic compound and the curable resin composition for forming the resin insulating layer (B) which contains a P atom-containing curing accelerator, the components contained therein may be the same except for the respective curing accelerators. Thus, those components that constitute the respective curable resin compositions used to form the resin insulating layer (A) which contains a curing accelerator composed of an N atom-containing basic compound and the resin insulating layer (B) which contains a P atom-containing curing accelerator may be common or different between the respective curable resin compositions; however, from the standpoints of the adhesion between the resin insulating layers and the cost, it is preferred that the components other than the respective curing accelerators be the same. Further, the curable resin composition for forming the resin insulating layer (A) which contains a curing accelerator composed of an N atom-containing basic compound contains substantially no P atom-containing curing accelerator, while the curable resin composition for forming the resin insulating layer (B) which contains a P atom-containing curing accelerator contains substantially no N atom-containing basic compound.

The present invention will now be described in more detail.

[Laminated Structure]

It is preferred that the resin insulating layers of the laminated structure according to the present invention be formed by the curable resin layers constituting the dry film of the present invention. Specifically, it is preferred that above-described resin insulating layer (A) which contains a curing accelerator composed of an N atom-containing basic compound and the above-described resin insulating layer (B) which contains a P atom-containing curing accelerator be formed by laminating the later-described dry film comprising a curable resin layer (A') which contains a curing accelerator composed of an N atom-containing basic compound and a curable resin layer (B') which contains a P atom-containing curing accelerator and then heat-curing the resulting laminate at a temperature of, for example, about 140 to 180° C.

In the laminated structure according to the present invention, the resin insulating layers may also be formed by directly applying the respective resin compositions onto a base material using an appropriate means, such as a blade coater, a lip coater, a comma coater or a film coater, and then drying the resultant. In this case, the resin insulating layers are formed such that the layer in contact with the base material is the resin insulating layer (A) which contains a curing accelerator composed of an N atom-containing basic compound. Alternatively, a method in which the above-described resin insulating layer (A) which contains a curing accelerator composed of an N atom-containing basic compound is formed by applying and drying a resin composition on a base material and then a dry film is laminated on the thus formed resin insulating layer (A) to form the above-described resin insulating layer (B) which contains a P atom-containing curing accelerator may also be employed.

Conversely, the laminated structure may also be obtained by laminating a dry film on a base material to form the above-described resin insulating layer (A) and then applying and drying the above-described resin composition on the thus formed resin insulating layer (A) to form the above-described resin insulating layer (B) which contains a P atom-containing curing accelerator.

In the laminated structure according to the present invention, the resin insulating layers can be patterned by irradiation with a semiconductor laser such as $CO_2$ laser or UV-YAG laser. Further, a hole can be formed using $CO_2$ laser, UV-YAG laser or a drill. The hole may be a penetrating hole (through-hole) which can conduct to an arbitrary layer of the laminated structure or a partial hole (conformal via) which is formed to attain conduction between the circuit of an inner layer and the surface of the laminated structure.

After the hole formation process, for the purposes of removing residues (smear) on the inner wall and the bottom of the thus formed hole and forming a roughened surface having fine irregularities so as to exert an effect of anchoring a conductor layer (which is a metal plating layer formed subsequently), the resulting laminated structure is treated with a commercially available desmear solution (roughening agent) or a solution containing an oxidizing agent such as a permanganate, a bichromate, ozone, hydrogen peroxide/sulfuric acid or nitric acid.

Then, by a subtractive method or a semi-additive method, a circuit is formed in the hole from which residues have been removed with a desmear solution or on the surface of the thus roughened coating film having fine irregularities. In either of these methods, after performing electroless plating, electrolytic plating or both of these platings, a heat treatment (annealing treatment) may also be performed at about 80° C. to 180° C. for about 10 minutes to 60 minutes in order to remove the stress of the metal and improve the strength.

The metal plating used in this process is not particularly restricted to, for example, copper, tin, solder and nickel, and a plurality of these metals may be used in combination. Further, it is also possible to perform metal sputtering in place of the metal plating.

In cases where the resin insulating layers are formed by a photosensitive curable resin layer and a dry coating film obtained by applying and drying a photosensitive resin composition, the curable resin layers and the dry coating film formed on the base material (substrate) are selectively exposed to an active energy ray through a patterned photomask by a contact method (or a non-contact method) or directly exposed to a pattern using a laser-direct exposure apparatus. Consequently, the exposed parts (the parts irradiated with the active energy ray) of the curable resin layers and the dry coating film are cured.

As an exposure apparatus for performing the irradiation with an active energy ray, a direct imaging device (for example, a laser direct imaging device which directly draws an image using a laser based on CAD data transmitted from a computer), an exposure apparatus equipped with a metal halide lamp, an exposure apparatus equipped with an (ultra) high-pressure mercury lamp, an exposure apparatus equipped with LED or an exposure apparatus equipped with a mercury short arc lamp can be employed.

As the active energy ray, it is preferred to use a light having the maximum wavelength in the range of 350 to 410 nm. By using a light having the maximum wavelength in this range, radicals can be efficiently generated from a photopolymerization initiator. Further, although the exposure does is variable depending on the film thickness and the like, it may be set in the range of generally 5 to 500 mJ/cm$^2$, preferably 10 to 300 mJ/cm$^2$.

As the direct imaging apparatus, for example, those that are manufactured by Orbotech Japan Co., Ltd., PENTAX Corporation, ORC Manufacturing Co., Ltd. and Dainippon Screen Mfg. Co., Ltd. can be employed, and any apparatus may be employed as long as it emits an active energy ray having the maximum wavelength in the range of 350 to 410 nm.

After exposing the curable resin layers and the dry coating film to cure the exposed part (the part irradiated with the active energy ray) in the above-described manner, the non-exposed part is developed with a dilute aqueous alkali solution (for example, 0.3 to 3%-by-mass aqueous sodium carbonate solution) to form a pattern on the curable resin layers and/or the dry coating film.

In this process, as a developing method, for example, a dipping method, a shower method, a spray method or a brushing method may be employed. Further, as a developer, an aqueous alkali solution of potassium hydroxide, sodium hydroxide, sodium carbonate, potassium carbonate, sodium phosphate, sodium silicate, ammonia, amine or the like may be employed.

Further, in cases where the curable resin layer or the curable resin composition contains a thermosetting component, by heat-curing the resulting film at a temperature of, for example, about 140 to 180° C., a reaction takes place between the carboxylic group of the carboxyl group-containing resin and the thermosetting component having, for example, a plurality of at least either cyclic ether groups or cyclic thioether groups in the molecule, so that a resin insulating layer (pattern) which is excellent in a variety of characteristics such as heat resistance, chemical resistance, resistance to moisture absorption, adhesiveness and insulation reliability can be formed.

In the laminated structure according to the present invention, the total thickness of the resin insulating layers is preferably not more than 100 μm, more preferably in the range of 5 to 50 μm. For example, in cases where the laminated structure has two resin insulating layers, it is preferred that the resin insulating layer (A) which contains a curing accelerator composed of an N atom-containing basic compound and the resin insulating layer (B) which contains a P atom-containing curing accelerator both have a thickness of 1 to 50 μm. Here, the ratio of the resin insulating layer (A) which contains a curing accelerator composed of an N atom-containing basic compound and the resin insulating layer (B) which contains a P atom-containing curing accelerator is preferably in the range of 1:9 to 9:1.

As the above-described base material, in addition to a printed circuit board or flexible printed circuit board on which a circuit has been formed in advance, for example, a copper-clad laminate of any grade (for example, FR-4) in which a composite material such as a paper-phenol resin, a paper-epoxy resin, a glass cloth-epoxy resin, a glass-polyimide, a glass cloth/nonwoven fabric-epoxy resin, a glass cloth/paper-epoxy resin, a synthetic fiber-epoxy resin, a fluorocarbon resin-polyethylene-polyphenylene ether composite or a polyphenylene oxide-cyanate ester composite is used, a polyimide film, a PET film, a glass substrate, a ceramic substrate or a wafer substrate can be employed.

The resin insulating layers of the laminated structure according to the present invention are suitable as a permanent coating film of a printed circuit board and particularly suitable as a solder resist or an interlayer insulating material.

[Dry Film]

As described in the above, the dry film of the present invention can be preferably used in the production of the laminated structure according to the present invention and comprises a curable resin layer (A') which contains a curing accelerator composed of an N atom-containing basic compound and a curable resin layer (B') which contains a P atom-containing curing accelerator that are formed on a carrier film. The curable resin layer (A') which contains a curing accelerator composed of an N atom-containing basic compound is preferably formed by application and drying of a curable resin composition which contains a basic compound having an N atom as a curing accelerator. Further, the curable resin layer (B') which contains a P atom-containing curing accelerator is preferably formed by application and drying of a curable resin composition which contains a P atom-containing curing accelerator.

In the dry film according to the present invention, the curable resin layer (A') which contains a curing accelerator composed of an N atom-containing basic compound is laminated in contact with a base material. Therefore, the layer in contact with the film or the outermost layer is the curable resin layer (A') which contains a curing accelerator composed of an N atom-containing basic compound. Preferably, the curable resin layer (A') which contains a curing accelerator composed of an N atom-containing basic compound is formed on a carrier film and the curable resin layer (B') which contains a P atom-containing curing accelerator is formed on top of the curable resin layer (A').

Further, the dry film according to the present invention can be produced by uniformly applying a resin composition onto a carrier film using an appropriate means such as a blade coater, a lip coater, a comma coater or a film coater; drying the resultant to form the respective curable resin layers described in the above; and then, preferably, laminating a cover film thereon. The material of the cover film may be the same as or different from that of the carrier film.

In the dry film according to the present invention, as the materials of the carrier film and cover film, any known material that may be used in a dry film can be employed.

As the carrier film, for example, a thermoplastic film such as a film made of polyester (e.g. polyethylene terephthalate), which has a thickness of 2 to 150 μm, may be employed.

As the cover film, for example, a polyethylene film or a polypropylene film may be employed, and the adhesive strength of the cover film with a curable resin layer is preferably smaller than that of the carrier film.

On the carrier of the present invention, the total thickness of the curable resin layers is preferably not more than 100 μm, more preferably in the range of 5 to 50 μm. For example, in cases where the dry film has two curable resin layers, it is preferred that the curable resin layer (A') which contains a curing accelerator composed of an N atom-containing basic compound and the curable resin layer (B') which contains a P atom-containing curing accelerator both have a thickness of 1 to 50 μm. Here, the ratio of the curable resin layer (A') which contains a curing accelerator composed of an N atom-containing basic compound and the curable resin layer (B') which contains a P atom-containing curing accelerator is preferably in the range of 1:9 to 9:1.

The components constituting the above-described dry film or curable resin composition will now be described in detail.

[N Atom-Containing Basic Compound]

The dry film or the curable resin composition, which is used for the formation of the resin insulating layer (A) which contains a curing accelerator composed of an N atom-containing basic compound, contains an N atom-containing basic compound as a curing accelerator. The N atom-containing basic compound may be any basic compound as long as it has an N atom in its molecular structure; however, it is preferably one which is known as a curing accelerator (curing catalyst) of an epoxy compound or an oxetane compound or as a curing accelerator (curing catalyst) for the reaction between an epoxy group or an oxetanyl group and a carboxyl group or a phenol group.

Examples of N atom-containing basic compound suitable in the present invention include imidazole derivatives such as dicyandiamide, melamine, imidazole, benzimidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds such as benzyldimethylamine, 4-(dimethylamino)-N,N-dimethylbenzylamine, 4-methoxy-N,N-dimethylbenzylamine and 4-methyl-N,N-dimethylbenzylamine; and heterocyclic compounds such as benzoxazole, benzothiazole and benzotriazole. These N atom-containing basic compounds may be used individually, or two or more thereof may be used in combination.

The content of the above-described N atom-containing basic compound is sufficient at any ordinary quantitative ratio and it is, for example, 0.01 to 15% by mass, more preferably 0.1 to 10% by mass, based on the total amount of the composition.

[P Atom-Containing Curing Accelerator]

The dry film or the curable resin composition, which is used for the formation of the resin insulating layer (B) which contains a P atom-containing curing accelerator, contains a P atom-containing curing accelerator. The P atom-containing curing accelerator to be used in the present invention may be any known curing accelerator (curing agent) as long as it has a P atom in the molecule; however, it is preferably one which is known as a curing accelerator (curing catalyst) of an epoxy compound or an oxetane compound or as a curing accelerator (curing catalyst) for the reaction between an epoxy group or an oxetanyl group and a carboxyl group or a phenol group.

Examples of P atom-containing curing catalyst which can be used in the present invention include tertiary phosphines such as triphenylphosphine, tri-p-tolylphosphine, tri-o-tolylphosphine, tri-m-tolylphosphine and tri-2,4-xylylphosphine; and quaternary phosphonium salts such as tetraphosphonium tetraphenylborate, tetraphenylphosphonium tetra-p-methylphenylborate, tetraphenylphosphonium thiocyanate and tetrabutylphosphonium decanoate. Thereamong, quaternary phosphonium salts are preferred. Further, thereamong, from the standpoint of the storage stability, tetraphenylphosphonium tetra-p-methylphenylborate is particularly preferred. These P atom-containing curing catalysts may be used individually, or two or more thereof may be used in combination.

The content of the above-described P atom-containing curing accelerator is sufficient at any ordinary quantitative ratio and it is, for example, 0.01 to 15% by mass, more preferably 0.1 to 10% by mass, based on the total amount of the composition.

[Curable Resin Composition]

The dry film and the curable resin composition, which are used for the formation of the resin insulating layer (A) which contains a curing accelerator composed of an N atom-containing basic compound or the resin insulating layer (B) which contains a P atom-containing curing accelerator, may be either photosensitive or non-photosensitive. As a photosensitive dry film or photosensitive resin composition, an alkali developing-type which contains a carboxyl group-containing resin or a phenol resin is preferred and, in particular, an alkali developing-type which contains a carboxyl group-containing resin, a photopolymerization initiator and a thermosetting component is more preferred.

[Carboxyl Group-Containing Resin]

As the carboxyl group-containing resin, a variety of conventionally known carboxyl group-containing resins having a carboxyl group in the molecule may be employed. In particular, from the standpoints of photocurability and resolution, a carboxyl group-containing photosensitive resin having an ethylenically unsaturated double bond in the molecule is preferred. It is preferred that the ethylenically unsaturated double bond be originated from acrylic acid, methacrylic acid or a derivative thereof. Here, in cases where a carboxyl group-containing non-photosensitive resin which does not have an ethylenically unsaturated double bond is used alone, in order to impart the composition with photocurability, it is required that the later-described compound having an ethylenically unsaturated group in the molecule, that is, a photo-polymerizable monomer be used in combination.

Specific examples of the carboxyl group-containing resin include the following compounds (that may each be either an oligomer or a polymer).

(1) A carboxyl group-containing photosensitive resin prepared by allowing a reaction product, which is obtained by a reaction between a compound having a plurality of phenolic hydroxyl groups in one molecule and an alkylene oxide such as ethylene oxide or propylene oxide, to react with an unsaturated group-containing monocarboxylic acid and then further allowing the thus obtained reaction product to react with a polybasic acid anhydride.

(2) A carboxyl group-containing photosensitive resin prepared by allowing the later-described polyfunctional (solid) epoxy resin, which has two or more functional groups, to react with (meth)acrylic acid and then adding a dibasic acid anhydride to a hydroxyl group existing in the side chain of the resultant.

(3) A carboxyl group-containing photosensitive resin prepared by allowing a polyfunctional epoxy resin, which is obtained by further epoxidizing a hydroxyl group of the later-described bifunctional (solid) epoxy resin with epichlorohydrin, to react with (meth)acrylic acid and then adding a dibasic acid anhydride to the resulting hydroxyl group.

(4) A carboxyl group-containing photosensitive resin prepared by allowing a reaction product, which is obtained by a reaction between a compound having a plurality of phenolic hydroxyl groups in one molecule and a cyclic carbonate compound such as ethylene carbonate or propylene carbonate, to react with an unsaturated group-containing monocarboxylic acid and then further allowing the thus obtained reaction product to react with a polybasic acid anhydride.

(5) A carboxyl group-containing photosensitive urethane resin obtained by a polyaddition reaction of a diisocyanate; a (meth)acrylate or partial acid anhydride-modified product of a bifunctional epoxy resin such as a bisphenol A-type epoxy resin, a hydrogenated bisphenol A-type epoxy resin, a bisphenol F-type epoxy resin, a bisphenol S-type epoxy resin, a bixylenol-type epoxy resin or a biphenol-type epoxy resin; a carboxyl group-containing dialcohol compound; and a diol compound.

(6) A carboxyl group-containing non-photosensitive resin obtained by copolymerization of an unsaturated carboxylic acid such as (meth)acrylic acid and an unsaturated group-containing compound such as styrene, $\alpha$-methylstyrene, a lower alkyl (meth)acrylate or isobutylene.

(7) A carboxyl group-containing non-photosensitive urethane resin obtained by a polyaddition reaction of a diisocyanate (e.g. an aliphatic diisocyanate, a branched aliphatic diisocyanate, an alicyclic diisocyanate or an aromatic diisocyanate), a carboxyl group-containing dialcohol compound (e.g. dimethylol propionic acid or dimethylol butanoic acid) and a diol compound (e.g. a polycarbonate-based polyol, a polyether-based polyol, a polyester-based polyol, a polyolefin-based polyol, an acrylic polyol, a bisphenol A-type alkylene oxide adduct diol or a compound having a phenolic hydroxyl group and an alcoholic hydroxyl group).

(8) A carboxyl group-containing non-photosensitive polyester resin prepared by allowing the later-described bifunctional oxetane resin to react with a dicarboxylic acid such as adipic acid, phthalic acid or hexahydrophthalic acid and then adding a dibasic acid anhydride, such as phthalic anhydride, tetrahydrophthalic anhydride or hexahydrophthalic anhydride, to the resulting primary hydroxyl group.

(9) A carboxyl group-containing photosensitive urethane resin having a (meth)acrylated terminal, which is obtained by adding a compound having one hydroxyl group and at least one (meth)acryloyl group in the molecule, such as hydroxyalkyl (meth)acrylate, during the synthesis of the resin described in the above (5) or (7).

(10) A carboxyl group-containing photosensitive urethane resin having a (meth)acrylated terminal, which is obtained by adding a compound having one isocyanate group and at least one (meth)acryloyl group in the molecule, such as an equimolar reaction product of isophorone diisocyanate and pentaerythritol triacrylate, during the synthesis of the resin described in the above (5) or (7).

(11) A carboxyl group-containing photosensitive resin obtained by further adding a compound having one epoxy group and at least one (meth)acryloyl group in one molecule to any one of the resins described in the above (1) to (10).

Here, the term "(meth)acrylate" used herein is a general term for acrylates, methacrylates and mixtures thereof and this is hereinafter applicable to all similar expressions.

Since such carboxyl group-containing resins described in the above have a number of carboxyl groups in the side chain of the backbone polymer, they can be developed with a dilute aqueous alkaline solution.

Further, the above-described carboxyl group-containing resin has an acid value in the range of appropriately 40 to 200 mg KOH/g, more preferably 45 to 120 mg KOH/g. When the acid value of the carboxyl group-containing resin is less than 40 mg KOH/g, development with an alkali may become difficult. Meanwhile, when the acid value is higher than 200 mg KOH/g, since the developing solution further dissolves the exposed part, the resulting lines may become excessively thin and in some cases, the exposed and non-exposed parts may be indistinctively dissolved and detached by the developing solution, making it difficult to draw a normal resist pattern; therefore, such an acid value is not preferred.

Further, the weight-average molecular weight of the above-described carboxyl group-containing resin varies depending on the resin skeleton; however, in general, it is preferably in the range of 2,000 to 150,000, more preferably in the range of 5,000 to 100,000. When the weight-average molecular weight is less than 2,000, the tack-free performance may be impaired and the moisture resistance of the resulting coating film after exposure may be deteriorated to cause a reduction in the film during development, which may greatly deteriorate the resolution. Meanwhile, when the weight-average molecular weight exceeds 150,000, the developing property may be markedly deteriorated and the storage stability may be impaired.

The content of such carboxyl group-containing resin is in the range of appropriately 20 to 60% by mass, preferably 30 to 60% by mass, based on the total amount of the composition. When the content of the carboxyl group-containing resin is less than the above-described range, for example, the strength of the resulting coating film may be reduced, which is not preferred. Meanwhile, when the content is higher than the above-described range, the viscosity of the composition may be increased and the coating properties and the like may be deteriorated, which are not preferred.

The carboxyl group-containing resin is not restricted to those enumerated in the above, and these carboxyl group-containing resins described in the above may be used individually, or two or more thereof may be used in combination. In particular, among the above-described carboxyl group-containing resins, those having an aromatic ring are preferred since they have a high refractive index and excellent resolution, and those having a novolac structure are more preferred since they not only have a high resolution but also are excellent in PCT and cracking resistance. Thereamong, the carboxyl group-containing photosensitive resins (1) and (2) are preferred since they can yield a solder resist having satisfactory properties such as PCT resistance, as well as excellent resolution.

[Photopolymerization Initiator]

As the above-described photopolymerization initiator, at least one photopolymerization initiator selected from the group consisting of oxime ester-based photopolymerization initiators having an oxime ester group, alkylphenone-based photopolymerization initiators, α-aminoacetophenone-based photopolymerization initiators, acylphosphine oxide-based photopolymerization initiators and titanocene-based photopolymerization initiators can be suitably used.

Particularly, the above-described oxime ester-based photopolymerization initiators are preferred since they can inhibit generation of outgas only in a small amount and exhibits an effect of imparting PCT resistance and cracking resistance.

Examples of commercially available oxime ester-based photopolymerization initiator include CGI-325, IRGACURE OXE01 and IRGACURE OXE02, which are manufactured by BASF Japan, Ltd.; and N-1919 and NCl-831, which are manufactured by ADEKA Corporation. Further, a photopolymerization initiator having two oxime ester groups in the molecule can also be suitably used, and specific examples thereof include those oxime ester compounds having a carbazole structure which are represented by the following formula:

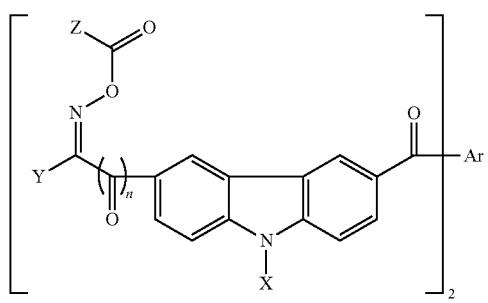

(wherein, X represents a hydrogen atom, an alkyl group having 1 to 17 carbon atoms, an alkoxy group having 1 to 8 carbon atoms, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms); Y and Z each independently represent a hydrogen atom, an alkyl group having 1 to 17 carbon atoms, an alkoxy group having 1 to 8 carbon atoms, a halogen group, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), an anthryl group, a pyridyl group, a benzofuryl group or a benzothienyl group; Ar represents a bond, an alkylene having 1 to 10 carbon atoms, a vinylene, a phenylene, a biphenylene, a pyridylene, a naphthylene, a thiophene, an anthrylene, a thienylene, a furylene, 2,5-pyrrole-diyl, 4,4'-stilbene-diyl or 4,2'-styrene-diyl; and n is an integer of 0 or 1).

Particularly, in the above-described formula, it is preferred that X and Y be each a methyl group or an ethyl group; Z be methyl or phenyl; n be 0; and Ar be a bond, a phenylene, a naphthylene, a thiophene or a thienylene.

Further, examples of preferred carbazole oxime ester compound include those compounds that are represented by the following formula:

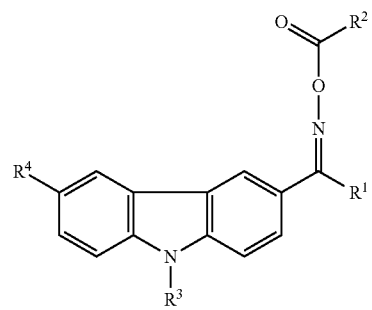

(wherein, $R^1$ represents an alkyl group having 1 to 4 carbon atoms or a phenyl group which is optionally substituted with a nitro group, a halogen atom or an alkyl group having 1 to 4 carbon atoms;

$R^2$ represents an alkyl group having 1 to 4 carbon atoms, an alkoxy group having 1 to 4 carbon atoms or a phenyl group which is optionally substituted with an alkyl or alkoxy group having 1 to 4 carbon atoms;

$R^3$ is optionally linked via an oxygen atom or a sulfur atom and represents an alkyl group having 1 to 20 carbon atoms which is optionally substituted with a phenyl group or a benzyl group which is optionally substituted with an alkoxy group having 1 to 4 carbon atoms;

$R^4$ represents a nitro group or an acyl group represented by X—C(=O)—; and

X represents an aryl group which is optionally substituted with an alkyl group having 1 to 4 carbon atoms, a thienyl group, a morpholino group, a thiophenyl group or a structure represented by the following formula).

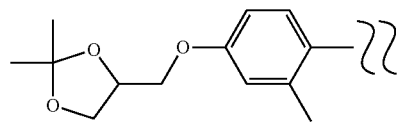

In addition to the above, examples of preferred carbazole oxime ester compound include those described in Japanese Unexamined Patent Application Publication Nos. 2004-

359639, 2005-097141, 2005-220097, 2006-160634, 2008-094770 and 2011-80036 and Japanese Translated PCT Patent Application Laid-open Nos. 2008-509967 and 2009-040762.

The content of such oxime ester-based photopolymerization initiator is preferably 0.01 to 5% by mass, more preferably 0.25 to 3% by mass, based on the total amount of the composition.

By controlling the content in the range of 0.01 to 5% by mass, a solder resist which not only has excellent photocurability and resolution, but also has an improved adhesive property and PCT resistance and exhibits excellent chemical resistance such as resistance to electroless gold plating, can be obtained.

In contrast, when the content is less than 0.01% by mass, not only the photocurability on copper becomes insufficient and the coating film of the resulting solder resist is detached, but also the properties of the coating film such as chemical resistance are deteriorated. Meanwhile, when the content is higher than 5% by mass, since light absorption on the surface of the coating film of the resulting solder resist becomes intense, the curability in a deep portion tends to be impaired.

Examples of commercially available alkylphenone-based photopolymerization initiator include α-hydroxyalkylphenone-type photopolymerization initiators such as IRGACURE 184, DAROCUR 1173, IRGACURE 2959 and IRGACURE 127, all of which are manufactured by BASF Japan Ltd.

Specific examples of the α-aminoacetophenone-based photopolymerization initiator include 2-methyl-1-[4-(methylthio)phenyl]-2-morpholinopropanone-1,2-benzyl-2-dimethylamino-1-(4-morpholinophenyl)-butane-1-one, 2-(dimethylamino)-2-[(4-methylphenyl)methyl]-1-[4-(4-morpholinyl)phenyl]-1-butanone and N,N-dimethylaminoacetophenone. Examples of commercially available α-aminoacetophenone-based photopolymerization initiator include IRGACURE 907, IRGACURE 369 and IRGACURE 379, all of which are manufactured by BASF Japan Ltd.

Specific examples of the acylphosphine oxide-based photopolymerization initiator include 2,4,6-trimethylbenzoyl diphenylphosphine oxide, bis(2,4,6-trimethylbenzoyl)-phenylphosphine oxide and bis(2,6-dimethoxybenzoyl)-2,4,4-trimethyl-pentylphosphine oxide. Examples of commercially available acylphosphine oxide-based photopolymerization initiator include LUCIRIN TPO and IRGACURE 819, which are manufactured by BASF Japan Ltd.

The content of such α-aminoacetophenone-based photopolymerization initiator and acylphosphine oxide-based photopolymerization initiator is preferably 0.1 to 25% by mass, more preferably 1 to 20% by mass, based on the total amount of the composition.

By controlling the content in the range of 0.1 to 25% by mass, a solder resist which not only has excellent photocurability and resolution, but also has an improved adhesive property and PCT resistance and exhibits excellent chemical resistance such as resistance to electroless gold plating, can be obtained.

In contrast, when the content is less than 0.1% by mass, not only the photocurability on copper becomes insufficient and the coating film of the resulting solder resist is detached, but also the properties of the coating film such as chemical resistance are deteriorated. Meanwhile, when the content is higher than 25% by mass, an outgas-reducing effect cannot attained and the light absorption on the surface of the resulting solder resist becomes intense, so that the curability in a deep portion of the solder resist tends to be impaired.

Further, as the photopolymerization initiator, IRGACURE 389 manufactured by BASF Japan Ltd. can also be suitably used. The content of IRGACURE 389 is suitably 0.1 to 20% by mass, more suitably 1 to 15% by mass, based on the total amount of the composition.

Further, a titanocene-based photopolymerization initiator such as IRGACURE 784 can also be suitably used. The content of such titanocene-based photopolymerization initiator is suitably 0.01 to 5% by mass, more suitably 0.01 to 3% by mass, based on the total amount of the composition.

By controlling the content of these photopolymerization initiators at a suitable level, a solder resist which not only has excellent photocurability and resolution, but also has an improved adhesive property and PCT resistance and exhibits excellent chemical resistance such as resistance to electroless gold plating, can be obtained.

In contrast, when the content is less than a suitable level, not only the photocurability on copper becomes insufficient and the resulting solder resist is detached, but also the properties of the solder resist such as chemical resistance are deteriorated. Meanwhile, when the content is higher than a suitable level, since light absorption on the surface of the resulting solder resist becomes intense, the curability in a deep portion tends to be impaired.

The above-described photosensitive resin composition may also contain a photoinitiator aid and/or a sensitizer in addition to the photopolymerization initiator. Examples of photopolymerization initiator, photoinitiator aid and sensitizer that can be suitably used in the photosensitive resin composition include benzoin compounds, acetophenone compounds, anthraquinone compounds, thioxanthone compounds, ketal compounds, benzophenone compounds, tertiary amine compounds and xanthone compound.

Specific examples of the benzoin compounds include benzoin, benzoin methyl ether, benzoin ethyl ether and benzoin isopropyl ether.

Specific examples of the acetophenone compounds include acetophenone, 2,2-dimethoxy-2-phenyl acetophenone, 2,2-diethoxy-2-phenyl acetophenone and 1,1-dichloroacetophenone.

Specific examples of the anthraquinone compounds include 2-methylanthraquinone, 2-ethylanthraquinone, 2-t-butylanthraquinone and 1-chloroanthraquinone.

Specific examples of the thioxanthone compounds include 2,4-dimethylthioxanthone, 2,4-diethylthioxanthone, 2-chlorothioxanthone and 2,4-diisopropylthioxanthone.

Specific examples of the ketal compounds include acetophenone dimethyl ketal and benzyldimethyl ketal.

Specific examples of the benzophenone compounds include benzophenone, 4-benzoyldiphenylsulfide, 4-benzoyl-4'-methyldiphenylsulfide, 4-benzoyl-4'-ethyldiphenylsulfide and 4-benzoyl-4'-propyldiphenylsulfide.

Specific examples of the tertiary amine compounds include ethanolamine compounds and compounds having a dialkylaminobenzene structure, and examples of commercially available products thereof include dialkylaminobenzophenones such as 4,4'-dimethylaminobenzophenone (NISSO CURE MABP manufactured by Nippon Soda Co., Ltd.) and 4,4'-diethylaminobenzophenone (EAB manufactured by Hodogaya Chemical Co., Ltd.); dialkylamino group-containing coumarin compounds such as 7-(diethylamino)-4-methyl-2H-1-benzopyran-2-one (7-(diethylamino)-4-methylcoumarin); ethyl-4-dimethylaminobenzoate (KAYACURE EPA manufactured by Nippon Kayaku Co., Ltd.); ethyl-2-dimethylaminobenzoate (QUANTA- CURE DMB manufactured by International BioSynthetics Inc.); (n-butoxy)ethyl-4-dimethylaminobenzoate (QUANTACURE BEA manufactured by International Bio Synthetics Inc.); isoamylethyl-p-dimethylaminobenzoate (KAYACURE DMBI manufactured by Nippon Kayaku Co., Ltd.); 2-ethylhexyl-4-dimethylaminobenzoate (ESOLOL 507 manufactured by Van Dyk GmbH); and 4,4'-diethylaminobenzophenone (EAB manufactured by Hodogaya Chemical Co., Ltd.).

Among the above-described compounds, thioxanthone compounds and tertiary amine compounds are preferred. In particular, from the standpoint of the curability of the resulting coating film in a deep portion, it is preferred that a thioxanthone compound such as 2,4-dimethylthioxanthone, 2,4-diethylthioxanthone, 2-chlorothioxanthone or 2,4-diisopropylthioxanthone be incorporated.

The content of such thioxanthone compound is preferably not higher than 20% by mass based on the total amount of the composition. When the content of the thioxanthone compound is higher than 20% by mass, the thick film curability is deteriorated, leading to an increase in the production cost. The content of the thioxanthone compound is more preferably not higher than 10% by mass.

Further, as the tertiary amine compound, those compounds having a dialkylaminobenzene structure are preferred. Thereamong, dialkylaminobenzophenone compounds; and dialkylamino group-containing coumarin compounds that have a maximum absorption wavelength in the range of 350 to 450 nm and ketocumarines are particularly preferred.

As the dialkylaminobenzophenone compound, 4,4'-diethylaminobenzophenone is preferred because of its low toxicity. Since a dialkylamino group-containing coumarin compound has a maximum absorption wavelength in the ultraviolet region of 350 to 410 nm, it causes little coloration, so that not only a colorless and transparent photosensitive composition can be provided, but also a colored solder resist which reflects the color of a coloring pigment itself can be provided by using a coloring pigment. In particular, 7-(diethylamino)-4-methyl-2H-1-benzopyran-2-one is preferred since it exhibits excellent sensitization effect against a laser beam having a wavelength of 400 to 410 nm.

The content of such tertiary amine compound is preferably 0.01 to 20% by mass based on the total amount of the composition. When the content of the tertiary amine compound is less than 0.01% by mass, sufficient sensitization effect is not likely to be attained. Meanwhile, when the content is higher than 20% by mass, the light absorption by the tertiary amine compound on the surface of a dried solder resist is increased, so that the curability of the solder resist in a deep portion tends to be impaired. The content of the tertiary amine compound is more preferably 0.5 to 10% by mass.

These photopolymerization initiators, photoinitiator aids and sensitizers may be used individually, or two or more thereof may be used in the form of a mixture.

It is preferred that the combined amount of the photopolymerization initiator(s), photoinitiator aid(s) and sensitizer(s) be not more than 30% by mass based on the total amount of the composition. When the amount exceeds 30% by mass, the light absorption by these components tends to deteriorate the curability of a deep portion.

[Thermosetting Component]

It is preferred that a thermosetting component be added to the above-described photosensitive resin composition. By adding a thermosetting component, the heat resistance is expected to be improved. Examples of such thermosetting component used in the present invention include amino resins such as melamine resins, benzoguanamine resins, melamine derivatives and benzoguanamine derivatives; blocked isocyanate compounds; cyclocarbonate compounds; polyfunctional epoxy compounds; polyfunctional oxetane compounds; and known thermosetting resins such as episulfide resins, bismaleimides and carbodiimide resins. Thereamong, a thermosetting component having at least either of a cyclic ether group and a cyclic thioether group (hereinafter, simply referred to as "cyclic (thio)ether group") in a plural number in one molecule is particularly preferred.

The above-described thermosetting component having a plurality of cyclic (thio)ether groups in the molecule is a compound having any one of or two of 3-, 4- and 5-membered cyclic (thio)ether groups in the molecule. Examples of such compound include compounds having a plurality of epoxy groups in the molecule, that is, polyfunctional epoxy compounds; compound having a plurality of oxetanyl groups in the molecule, that is, polyfunctional oxetane compounds; and compounds having a plurality of thioether groups in the molecule, that is, episulfide resins.

Examples of the above-described polyfunctional epoxy compounds include, but not limited to, epoxidized vegetable oils such as ADK CIZER O-130P, ADK CIZER O-180A, ADK CIZER D-32 and ADK CIZER D-55, which are manufactured by ADEKA Corporation; bisphenol A-type epoxy resins such as jER828, jER834, jER1001 and jER1004, which are manufactured by Mitsubishi Chemical Corporation, EHPE3150 manufactured by Daicel Chemical Industries, Ltd., EPICLON 840, EPICLON 850, EPICLON 1050 and EPICLON 2055, which are manufactured by DIC Corporation, EPOTOHTO YD-011, YD-013, YD-127 and YD-128, which are manufactured by Tohto Kasei Co., Ltd., D.E.R.317, D.E.R.331, D.E.R.661 and D.E.R.664, which are manufactured by The Dow Chemical Company, SUMI-EPDXY ESA-011, ESA-014, ELA-115 and ELA-128, which are manufactured by Sumitomo Chemical Co., Ltd., and A.E.R.330, A.E.R.331, A.E.R.661 and A.E.R.664, which are manufactured by Asahi Chemical Industry Co., Ltd. (all of the above are trade names); hydroquinone-type epoxy resin YDC-1312, bisphenol-type epoxy resin YSLV-80XY and thioether-type epoxy resin YSLV-120TE (all of which are manufactured by Tohto Kasei Co., Ltd.); brominated epoxy resins such as jERYL903 manufactured by Mitsubishi Chemical Corporation, EPICLON 152 and EPICLON 165, which are manufactured by DIC Corporation, EPOTOHTO YDB-400 and YDB-500, which are manufactured by Tohto Kasei Co., Ltd., D.E.R.542 manufactured by The Dow Chemical Company, SUMI-EPDXY ESB-400 and ESB-700, which are manufactured by Sumitomo Chemical Co., Ltd., and A.E.R.711 and A.E.R.714, which are manufactured by Asahi Chemical Industry Co., Ltd. (all of the above are trade names); novolac-type epoxy resins such as jER152 and jER154, which are manufactured by Mitsubishi Chemical Corporation, D.E.N.431 and D.E.N.438, which are manufactured by The Dow Chemical Company, EPICLON N-730, EPICLON N-770 and EPICLON N-865, which are manufactured by DIC Corporation, EPOTOHTO YDCN-701 and YDCN-704, which are manufactured by Tohto Kasei Co., Ltd., EPPN-201, EOCN-1025, EOCN-1020, EOCN-104S and RE-306, which are manufactured by Nippon Kayaku Co., Ltd., SUMI-EPDXY ESCN-195X and ESCN-220, which are manufactured by Sumitomo Chemical Co., Ltd., and A.E.R.ECN-235 and ECN-299, which are manufactured by Asahi Chemical Industry Co., Ltd., (all of the above are trade names); biphenol novolac-type epoxy resins such as NC-3000 and NC-3100, which are manufactured by Nippon Kayaku Co., Ltd.; bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004 which are manufactured by Tohto Kasei Co., Ltd.; hydrogenated bisphenol A-type epoxy resins such as EPOTOHTO ST-2004, ST-2007 and ST-3000 (trade names) which are manufactured by Tohto Kasei Co., Ltd.; glycidyl amine-type epoxy resins such as jER604 manufactured by Mitsubishi Chemical Corporation, EPOTOHTO YH-434 manufactured by Tohto Kasei Co., Ltd. and SUMI-EPDXY ELM-120 manufactured by Sumitomo Chemical Co., Ltd. (all of the above are trade names); hydantoin-type epoxy resins; alicyclic epoxy resins such as CELLOXIDE 2021 and CY179 (trade names), which are manufactured by Daicel Chemical Industries, Ltd.; trihydroxyphenyl methane-type epoxy resins such as YL-933 manufactured by Mitsubishi Chemical Corporation and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenol S-type epoxy resins such as EBPS-200 manufactured by Nippon Kayaku Co., Ltd., EPX-30 manufactured by ADEKA Corporation and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as BLEMMER DGT manufactured by NOF Corporation; tetraglycidyl xylenoylethane resins such as ZX-1063 manufactured by Tohto Kasei Co., Ltd.; naphthalene group-containing epoxy resins such as ESN-190 and ESN-360, which are manufactured by Nippon Steel Chemical Co., Ltd., and HP-4032, EXA-4750 and EXA-4700, which are manufactured by DIC Corporation; epoxy resins having a dicyclopentadiene skeleton, such as HP-7200 and HP-7200H manufactured by DIC Corporation; glycidyl methacrylate copolymer-based epoxy resins such as CP-50S and CP-50M manufactured by NOF Corporation; cyclohexylmaleimide-glycidyl methacrylate copolymer epoxy resins; epoxy-modified polybutadiene rubber derivatives (for example, PB-3600 manufactured by Daicel Chemical Industries, Ltd.); and CTBN-modified epoxy resins (for example, YR-102 and YR-450 manufactured by Tohto Kasei Co., Ltd.). These epoxy resins may be used individually, or two or more thereof may be used in combination. Thereamong, novolac-type epoxy resins, bixylenol-type epoxy resins, biphenol-type epoxy resins, biphenol novolac-type epoxy resins, naphthalene-type epoxy resins and mixtures thereof are particularly preferred.

Examples of the polyfunctional oxetane compounds include polyfunctional oxetanes such as bis[(3-methyl-3-oxcetanylmethoxy)methyl]ether, bis[3-ethyl-3-oxcetanyl-methoxy)methyl]ether, 1,4-bis[(3-methyl-3-oxcetanyl-methoxy)methyl]benzene, 1,4-bis[(3-ethyl-3-oxcetanylmethoxy)methyl]benzene, (3-methyl-3-oxcetanyemethyl acrylate, (3-ethyl-3-oxcetanyl)methyl acrylate, (3-methyl-3-oxcetanyl)methyl methacrylate, (3-ethyl-3-oxcetanyl)methyl methacrylate, and oligomers and copolymers thereof; and etherification products of an oxetane alcohol and a resin having a hydroxyl group such as a novolac resin, a poly(p-hydroxystyrene), a cardo-type bisphenol, a calixarene, a calix resorcin arene or a silsesquioxane. In addition, examples of the polyfunctional oxetane compounds also include copolymers of an unsaturated monomer having an oxetane ring and an alkyl(meth)acrylate.

Examples of the compounds having a plurality of cyclic thioether groups in the molecule include bisphenol A-type episulfide resin YL7000 manufactured by Mitsubishi Chemical Corporation. Further, for example, an episulfide resin prepared by the same synthesis method, in which an oxygen atom of an epoxy group of a novolac-type epoxy resin is substituted with a sulfur atom, can also be used.

The content of such thermosetting component having a plurality of cyclic (thio)ether groups in the molecule is preferably 0.6 to 2.5 equivalents with respect to 1 equivalent of carboxyl group in the above-described carboxyl group-containing resin or 1 equivalent of phenol group in the phenol resin. When the content is less than 0.6 equivalent, the carboxyl group remains in the resulting solder resist, causing deterioration in the heat resistance, alkali resistance, electrical insulation properties and the like. Meanwhile, when the content is higher than 2.5 equivalents, cyclic (thio)ether groups having a low molecular weight remain in the resulting dry coating film, causing deterioration in the coating film strength and the like. The content of the thermosetting component having a plurality of cyclic (thio) ether groups in the molecule is more preferably 0.8 to 2.0 equivalents.

Further, examples of other thermosetting component include amino resins such as melamine derivatives and benzoguanamine derivatives, such as methylol melamine compounds, methylol benzoguanamine compounds, methylol glycoluril compounds and methylol urea compounds. Moreover, alkoxymethylated melamine compounds, alkoxymethylated benzoguanamine compounds, alkoxymethylated glycoluril compounds and alkoxymethylated urea compounds are obtained by converting the methylol group of the respective methylol melamine compounds, methylol benzoguanamine compounds, methylol glycoluril compounds and methylol urea compounds into an alkoxymethyl group. The type of this alkoxymethyl group is not particularly restricted and examples thereof include methoxymethyl group, ethoxymethyl group, propoxymethyl group and butoxymethyl group. In particular, a melamine derivative having a formalin concentration of not higher than 0.2%, which is not harmful to human body and environment, is preferred.

Examples of commercially available products of the above-described thermosetting components include CYMEL 300, 301, 303, 370, 325, 327, 701, 266, 267, 238, 1141, 272, 202, 1156, 1158, 1123, 1170, 1174, UFR65 and 300 (all of which are manufactured by Mitsui Cyanamid Co., Ltd.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.). These thermosetting components may be used individually, or two or more thereof may be used in combination.

In the photosensitive resin composition used in the present invention, a compound having a plurality of isocyanate groups or blocked isocyanate groups in one molecule may also be added. Examples of such compound include polyisocyanate compounds and blocked isocyanate compounds. Here, the term "blocked isocyanate group" refers to a group in which isocyanate group is protected and thus temporarily inactivated by a reaction with a blocking agent. When heated to a prescribed temperature, the blocking agent dissociates to yield an isocyanate group. It has been confirmed that the curability of the photosensitive resin composition and the toughness of the resulting cured product are improved by adding the above-described polyisocyanate compound or blocked isocyanate compound.

As such polyisocyanate compound, for example, an aromatic polyisocyanate, an aliphatic polyisocyanate or an alicyclic polyisocyanate may be employed.

Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate and 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate.

Specific examples of the alicyclic polyisocyanate include bicycloheptane triisocyanate as well as adducts, biurets and isocyanurates of the above-described isocyanate compounds.

As the blocked isocyanate compound, a product obtained by an addition reaction between an isocyanate compound and an isocyanate blocking agent may be employed. Examples of an isocyanate compound which can react with a blocking agent include the above-described polyisocyanate compounds.

Examples of the isocyanate blocking agent include phenolic blocking agents such as phenol, cresol, xylenol, chlorophenol and ethylphenol; lactam-based blocking agents such as ∈-caprolactam, δ-valerolactam, γ-butyrolactam and β-propiolactam; activated methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The blocked isocyanate compound may be a commercially available product and examples thereof include SUMIDUR BL-3175, BL-4165, BL-1100 and BL-1265, DESMODUR TPLS-2957, TPLS-2062, TPLS-2078 and TPLS-2117 and DESMOTHERM 2170 and 2265 (all of which are manufactured by Sumitomo Bayer Urethane Co., Ltd.); CORONATE 2512, CORONATE 2513 and CORONATE 2520 (all of which are manufactured by Nippon Polyurethane Industry Co., Ltd.); B-830, B-815, B-846, B-870, B-874 and B-882 (all of which are manufactured by Mitsui Takeda Chemicals Inc.); and TPA-B80E, 17B-60PX and E402-B80T (all of which are manufactured by Asahi Kasei Chemicals Corporation). It is noted here that SUMI-DUR BL-3175 and BL-4265 are produced by using methylethyl oxime as a blocking agent. The above-described compounds having a plurality of isocyanate groups or blocked isocyanate groups in one molecule may be used individually, or two or more thereof may be used in combination.

The content of such compound having a plurality of isocyanate groups or blocked isocyanate groups in one molecule is preferably 0.1 to 50% by mass based on the total amount of the composition. When the content is less than 0.1% by mass, a coating film having sufficient toughness may not be obtained. Meanwhile, when the content is higher than 50% by mass, the storage stability is deteriorated. The content of the compound having a plurality of isocyanate groups or blocked isocyanate groups in one molecule is more preferably 1 to 30% by mass.

It is preferred that the photosensitive resin composition, which is suitably used as a dry film or curable resin composition for forming the resin insulating layer (A) which contains a curing accelerator composed of an N atom-containing basic compound and the resin insulating layer (B) which contains a P atom-containing curing accelerator, further contain a photosensitive monomer, a filler and a cyanate compound.

[Photosensitive Monomer]

It is preferred that the above-described photosensitive resin composition contain, as a photosensitive monomer, a compound having an ethylenically unsaturated group in the molecule. The compound having an ethylenically unsaturated group in the molecule is photo-cured when irradiated with an active energy ray, thereby insolubilizing or assisting to insolubilize the photosensitive resin composition of the present invention to an aqueous alkaline solution. As such a compound, a commonly used and known polyester (meth) acrylate, polyether (meth)acrylate, urethane (meth)acrylate, carbonate (meth)acrylate, epoxy (meth)acrylate or urethane (meth)acrylate may be employed, and specific examples thereof include hydroxyalkyl acrylates such as 2-hydroxyethyl acrylate and 2-hydroxypropyl acrylate; diacrylates of glycol such as ethylene glycol, methoxytetraethylene glycol, polyethylene glycol and propylene glycol; acrylamides such as N,N-dimethylacrylamide, N-methylolacrylamide and N,N-dimethylaminopropylacrylamide; aminoalkyl acrylates such as N,N-dimethylaminoethyl acrylate and N,N-dimethylaminopropyl acrylate; polyvalent acrylates of polyhydric alcohols (e.g. hexanediol, trimethylolpropane, pentaerythritol, dipentaerythritol and tris-hydroxyethyl isocyanurate) or ethylene oxide adducts, propylene oxide adducts or ∈-caprolactone adducts of these polyhydric alcohols; polyvalent acrylates such as phenoxyacrylate, bisphenol A diacrylate and ethylene oxide adducts or propylene oxide adducts of these phenols; and polyvalent acrylates of glycidyl ethers such as glycerin diglycidyl ether, glycerin triglycidyl ether, trimethylolpropane triglycidyl ether and triglycidyl isocyanate. In addition to the above, examples also include acrylates and melamine acrylates that are obtained by direct acrylation or diisocyanate-mediated urethane acrylation of a polyol such as polyether polyol, polycarbonate diol, hydroxyl group-terminated polybutadiene or polyester polyol; and at least one of methacrylates corresponding to the above-described acrylates.

Further, as the photosensitive monomer, for example, an epoxy acrylate resin which is obtained by allowing a polyfunctional epoxy resin such as a cresol novolac-type epoxy resin to react with acrylic acid or an epoxy urethane acrylate compound which is obtained by allowing the hydroxyl group of the above-described epoxy acrylate resin to react with a hydroxyacrylate such as pentaerythritol triacrylate and a half urethane compound of diisocyanate such as isophorone diisocyanate may also be employed. Such an epoxy acrylate-based resin is capable of improving the photocurability of the photosensitive resin composition without impairing the dryness to touch.

The above-described compounds having an ethylenically unsaturated group in the molecule may be used individually, or two or more thereof may be used in combination. In particular, from the standpoints of photoreactivity and resolution, a compound having 4 to 6 ethylenically unsaturated groups in one molecule is preferred. Further, a compound having two ethylenically unsaturated groups in one molecule is also preferably used since it lowers the linear thermal expansion coefficient of the resulting cured product and reduces the occurrence of peeling during PCT.

The content of the above-described compound having an ethylenically unsaturated group(s) in the molecule is preferably 2 to 50% by mass based on the total amount of the composition. When the content is less than 2% by mass, the photocurability of the photosensitive resin composition is impaired, so that it may become difficult to form a pattern by development with an alkali after irradiation with an active energy ray. Meanwhile, when the content is higher than 50% by mass, the solubility of the photosensitive resin composition to a dilute aqueous alkali solution may be reduced, making the resulting coating film fragile. The content of the above-described compound having an ethylenically unsaturated group(s) in the molecule is more preferably 3 to 40% by mass.

So far, the photosensitive resin composition has been described. However, in cases where the dry film or the curable resin composition, which is used to form the resin insulating layer (A) which contains a curing accelerator composed of an N atom-containing basic compound and the resin insulating layer (B) which contains a P atom-containing curing accelerator, is a non-photosensitive material, it is preferred that the material be a thermosetting resin composition which contains a curing accelerator and a thermosetting component. Since such a non-photosensitive resin composition is not required to provide photosensitivity, it does not have to contain the above-described carboxyl group-containing resin, photosensitive monomer and photopolymerization initiator. Further, it is also preferred that the thermosetting resin composition contain a component such as a cyanate compound in addition to a curing accelerator and a thermosetting component. Examples of the curing accelerator, thermosetting component, cyanate compound and phenol resin include the same ones as those enumerated for the above-described components. In addition, the thermosetting resin composition may also contain the same arbitrary component(s) as those that are described in the above for the photosensitive resin composition. The thermosetting resin composition can be heat-cured at a temperature of, for example, 140 to 180° C. after being applied to a base material.

The arbitrary components will now be described.

[Filler]

It is preferred that the curable resin composition used in the present invention contain an inorganic filler. The inorganic filler is used for inhibiting shrinkage on curing of a cured product of the curable resin composition and improving its characteristics such as adhesive property and hardness. Examples of the inorganic filler include barium sulfate, barium titanate, amorphous silica, crystalline silica, Neuburg siliceous earth, molten silica, spherical silica, talc, clay, magnesium carbonate, calcium carbonate, aluminum oxide, aluminum hydroxide, silicon nitride and aluminum nitride.

It is preferred that the above-described inorganic filler have an average particle size of not larger than 5 μm. The content thereof is preferably not higher than 75% by mass, more preferably 0.1 to 60% by mass, based on the total amount of the composition. When the content of the inorganic filler is higher than 75% by mass, the viscosity of the composition may be increased to impair the coating properties and the resulting cured product of the curable resin composition may become fragile.

[Cyanate Compound]

It is preferred that the above-described curable resin composition contain a cyanate resin. By the cyanate resin, the curable resin composition can be imparted with, for example, high heat resistance, low dielectric dissipation factor and low thermal expansion coefficient. The cyanate resin is not particularly restricted and a prepolymer obtained by subjecting a cyanate ester monomer having a cyanate group (—O—C≡N) or a polyfunctional cyanate ester monomer to a preliminary reaction can be employed. Examples thereof include novolac-type (such as phenol novolac-type or alkylphenol novolac-type) cyanate resins; dicyclopentadiene-type cyanate resins; bisphenol-type (such as bisphenol A-type, bisphenol F-type or bisphenol S-type) cyanate resins; and prepolymers obtained by partially converting these cyanate resins into triazine. Further, as the cyanate resin, a resin obtained by subjecting a monomer or prepolymer of a polyfunctional cyanate ester, such as 2,2-bis(4-cyanatophenyl)propane, and a monomer or prepolymer of a polyfunctional maleimide, such as bismaleimide, to a preliminary reaction or pre-mixing at a mass ratio of 95:5 to 5:95 (for example, BT RESIN manufactured by Mitsubishi Gas Chemical Company, Inc.) can also be employed. These cyanate resins may be used individually, or two or more thereof may be used in combination.

Specific examples of the cyanate resin include bifunctional cyanate resins such as bisphenol A dicyanate, polyphenol cyanate(oligo(3-methylene-1,5-phenylenecyanate), 4,4'-methylenebis(2,6-dimethylphenylcyanate), 4,4'-ethylidenediphenyl dicyanate, 2,2-bis(4-cyanatophenyl)hexafluoropropane, 2,2-bis(4-cyanatophenyl)propane, 1,1-bis(4-cyanatophenyl)methane, bis(4-cyanato-3,5-dimethylphenyl)methane, 1,3-bis(4-cyanatophenyl-1-(methylethylidene))benzene, bis(4-cyanatophenyl)thioether and bis(4-cyanatophenyl)ethane; polyfunctional cyanate resins derived from a phenol-novolac resin, a cresol-novolac resin, a dicyclopentadiene structure-containing phenol resin or the like; and prepolymers obtained by partially converting these cyanate resins into triazine.

Examples of commercially available cyanate resin include: as a phenol novolac-type polyfunctional cyanate resin, PT30 manufactured by LONZA Japan Ltd. (cyanate equivalent: 124); as a trimeric prepolymer obtained by partially or entirely converting bisphenol A dicyanate into triazine, BA230 manufactured by LONZA Japan Ltd. (cyanate equivalent: 232); and, as dicyclopentadiene structure-containing cyanate resins, DT-4000 and DT-7000 manufactured by LONZA Japan Ltd.

The content of the above-described cyanate resin is preferably 1 to 50% by mass based on the total amount of the composition. When the content is higher than 50% by mass, the developing property is deteriorated. The content of the cyanate resin is more preferably 2 to 30% by mass.

The above-described curable resin composition may further contain, as arbitrary components, at least one of organic solvents, elastomers, mercapto compounds, coloring agents, antioxidants, ultraviolet absorbers, adhesion-promoting agents, polymerization inhibitors, fine-powder silica, organic bentonite, thickening agents such as montmorillonite, antifoaming agents (e.g. silicone-based, fluorine-based and polymer-based antifoaming agents) and leveling agents, as well as a known additive(s) such as a silane-coupling agent (e.g. an imidazole-based, thiazole-based or triazole-based silane-coupling agent), a corrosion inhibitor, a flame retardant (e.g. a phosphorus compound such as phosphinate, phosphate derivative or phosphazene compound) and/or a block copolymer.

[Organic Solvent]

The above-described curable resin composition may also contain an organic solvent for the purpose of synthesizing the above-described carboxyl group-containing resin, preparing the composition or adjusting the viscosity thereof for application onto a base material or a carrier film.

Examples of such an organic solvent include ketones, aromatic hydrocarbons, glycol ethers, glycol ether acetates, esters, alcohols, aliphatic hydrocarbons and petroleum-based solvents. More specific examples thereof include ketones such as methyl ethyl ketone and cyclohexanone; aromatic hydrocarbons such as toluene, xylene and tetramethylbenzene; glycol ethers such as cellosolve, methylcellosolve, butylcellosolve, carbitol, methylcarbitol, butylcarbitol, propylene glycol monomethyl ether, dipropylene glycol monomethyl ether, dipropylene glycol diethyl ether and triethylene glycol monoethyl ether; esters such as ethyl acetate, butyl acetate, dipropylene glycol methyl ether acetate, propylene glycol methyl ether acetate, propylene glycol ethyl ether acetate and propylene glycol butyl ether acetate; alcohols such as ethanol, propanol, ethylene glycol and propylene glycol; aliphatic hydrocarbons such as octane and decane; and petroleum-based solvents such as petroleum ether, petroleum naphtha, hydrogenated petroleum naphtha and solvent naphtha. These organic solvents may be used individually, or two or more thereof may be used in the form of a mixture.

[Elastomer]

To the above-described curable resin composition, an elastomer having a functional group may be added. By adding an elastomer having a functional group, the coating properties are improved and the strength of the resulting coating film is also expected to be improved. Examples of the trade name of such elastomer having a functional group include R-45HT and Poly bd HTP-9 (both of which are manufactured by Idemitsu Kosan Co., Ltd.); EPOLEAD PB3600 (manufactured by Daicel Chemical Industries, Ltd.); DENAREX R-45EPT (manufactured by Nagase ChemteX Corporation); and RICON 130, RICON 131, RICON 134, RICON 142, RICON 150, RICON 152, RICON 153, RICON 154, RICON 156, RICON 157, RICON 100, RICON 181, RICON 184, RICON 130MA8, RICON 130MA13, RICON 130MA20, RICON 131MA5, RICON 131MA10, RICON 131MA17, RICON 131MA20, RICON 184MA6 and RICON 156MA17 (all of which are manufactured by Sartomer Co., Ltd.). As the elastomer having a functional group, a polyester-based elastomer, a polyester urethane-based elastomer, a polyamide-based elastomer, a polyester amide-based elastomer, an acrylic elastomer or an olefin-based elastomer can also be employed. In addition, for example, a resin which is obtained by modifying some or all of epoxy groups contained in an epoxy resin having various skeletons with a butadiene-acrylonitrile rubber whose terminals are both modified with carboxylic acid can also be employed. Moreover, for example, an epoxy-containing polybutadiene-based elastomer, an acryl-containing polybutadiene-based elastomer, a hydroxyl group-containing polybutadiene-based elastomer or a hydroxyl group-containing isoprene-based elastomer can also be employed. The appropriate content of the elastomer is in the range of 1 to 50% by mass, preferably 3 to 30% by mass, based on the total amount of the composition. Further, the above-described elastomers may be used individually, or two or more thereof may be used in combination.

[Mercapto Compound]

To the above-described curable resin composition, a mercapto compound may also be added as required. In particular, by adding a mercapto compound to the curable resin composition used to form the resin insulating layer on the side which is in contact with the base material, the PCT resistance and the HAST resistance are expected to be improved. This is believed to be attributable to an improvement in the adhesive property.

Examples of the mercapto compound include mercaptoethanol, mercaptopropanol, mercaptobutanol, mercaptopropanediol, mercaptobutanediol, hydroxybenzenethiol and derivatives thereof, such as 1-butanethiol, butyl-3-mercaptopropionate, methyl-3-mercaptopropionate, 2,2-(ethylenedioxy)diethanethiol, ethanethiol, 4-methylbenzenethiol, dodecyl mercaptan, propanethiol, butanethiol, pentanethiol, 1-octanethiol, cyclopentanethiol, cyclohexanethiol, thioglycerol and 4,4-thiobisbenzenethiol.

Examples of the commercially available mercapto compound include BMPA, MPM, EHMP, NOMP, MBMP, STMP, TMMP, PEMP, DPMP and TEMPIC (which are manufactured by Sakai Chemical Industry Co., Ltd.); and KARENZ MT-PE1, KARENZ MT-BD1 and KARENZ NR1 (which are manufactured by Showa Denko K.K.).

Further, examples of a mercapto compound having a heterocyclic ring include mercapto-4-butyrolactone (synonym: 2-mercapto-4-butanolide), 2-mercapto-4-methyl-4-butyrolactone, 2-mercapto-4-ethyl-4-butyrolactone, 2-mercapto-4-butyrothiolactone, 2-mercapto-4-butyrolactam, N-methoxy-2-mercapto-4-butyrolactam, N-ethoxy-2-mercapto-4-butyrolactam, N-methyl-2-mercapto-4-butyrolactam, N-ethyl-2-mercapto-4-butyrolactam, N-(2-methoxy)ethyl-2-mercapto-4-butyrolactam, N-(2-ethoxy)ethyl-2-mercapto-4-butyrolactam, 2-mercapto-5-valerolactone, 2-mercapto-5-valerolactam, N-methyl-2-mercapto-5-valerolactam, N-ethyl-2-mercapto-5-valerolactam, N-(2-methoxy)ethyl-2-mercapto-5-valerolactam, N-(2-ethoxy)ethyl-2-mercapto-5-valerolactam, 2-mercaptobenzothiazole, 2-mercapto-5-methylthio-thiadiazole, 2-mercapto-6-hexanolactam, 2,4,6-trimercapto-s-triazine (manufactured by Sankyo Kasei Co., Ltd.: trade name "ZISNET F"), 2-dibutylamino-4,6-dimercapto-s-triazine (manufactured by Sankyo Kasei Co., Ltd.: trade name "ZISNET DB") and 2-anilino-4,6-dimercapto-s-triazine (manufactured by Sankyo Kasei Co., Ltd.: trade name "ZISNET AF").

Thereamong, 2-mercaptobenzoimidazole, 2-mercaptobenzoxazole, 2-mercaptobenzothiazole (trade name: ACCEL M; manufactured by Kawaguchi Chemical Industry Co., Ltd.), 3-mercapto-4-methyl-4H-1,2,4-triazole, 5-methyl-1,3,4-thiadiazole-2-thiol and 1-phenyl-5-mercapto-1H-tetrazole are preferred.

The content of such mercapto compound is appropriately 0.01% by mass to 10.0% by mass, more preferably 0.05% by mass to 5% by mass, based on the total amount of the composition. When the content is less than 0.01% by mass, no improvement in the adhesive property is observed as an effect of adding a mercapto compound, while when the content is higher than 10.0% by mass, there may be caused a defect in the development of the photosensitive resin composition and a reduction in the range where drying can be controlled; therefore, such a content of mercapto compound is not preferred. The above-described mercapto compounds may be used individually, or two or more thereof may be used in combination.

[Coloring Agent]

The above-described curable resin composition may also contain a coloring agent. As the coloring agent, a commonly used and known coloring agent of red, blue, green, yellow or the like may be employed, and it may be any of a pigment, a stain or a dye. Specific examples of the coloring agent include those assigned with the following Color Index numbers (C.I.; issued by The Society of Dyers and Colourists). Here, from the standpoints of reducing the environmental stress and the effects on human body, it is preferred that the coloring agent contain no halogen.

Red Coloring Agent:

Examples of red coloring agent include monoazo-type, disazo-type, azo lake-type, benzimidazolone-type, perylene-type, diketopyrrolopyrrole-type, condensed azo-type, anthraquinone-type and quinacridone-type red coloring agents, and specific examples thereof include the followings.

Monoazo-type: Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268 and 269

Disazo-type: Pigment Red 37, 38 and 41

Monoazo lake-type: Pigment Red 48:1, 48:2, 48:3, 48:4, 49:1, 49:2, 50:1, 52:1, 52:2, 53:1, 53:2, 57:1, 58:4, 63:1, 63:2, 64:1 and 68

Benzimidazolone-type: Pigment Red 171, Pigment Red 175, Pigment Red 176, Pigment Red 185 and Pigment Red 208

Perylene-type: Solvent Red 135, Solvent Red 179, Pigment Red 123, Pigment Red 149, Pigment Red 166, Pigment Red 178, Pigment Red 179, Pigment Red 190, Pigment Red 194 and Pigment Red 224

Diketopyrrolopyrrole-type: Pigment Red 254, Pigment Red 255, Pigment Red 264, Pigment Red 270 and Pigment Red 272

Condensed azo-type: Pigment Red 220, Pigment Red 144, Pigment Red 166, Pigment Red 214, Pigment Red 220, Pigment Red 221 and Pigment Red 242

Anthraquinone-type: Pigment Red 168, Pigment Red 177, Pigment Red 216, Solvent Red 149, Solvent Red 150, Solvent Red 52 and Solvent Red 207

Quinacridone-type: Pigment Red 122, Pigment Red 202, Pigment Red 206, Pigment Red 207 and Pigment Red 209

Blue Coloring Agent:

Examples of blue coloring agent include phthalocyanine-type and anthraquinone-type blue coloring agents and examples of pigment-type blue coloring agent include those compounds that are classified into pigment. Specific examples thereof include Pigment Blue 15, Pigment Blue 15:1, Pigment Blue 15:2, Pigment Blue 15:3, Pigment Blue 15:4, Pigment Blue 15:6, Pigment Blue 16 and Pigment Blue 60.

As a stain-type blue coloring agent, for example, Solvent Blue 35, Solvent Blue 63, Solvent Blue 68, Solvent Blue 70, Solvent Blue 83, Solvent Blue 87, Solvent Blue 94, Solvent Blue 97, Solvent Blue 122, Solvent Blue 136, Solvent Blue 67 and Solvent Blue 70 can be used. In addition to the above-described ones, a metal-substituted or unsubstituted phthalocyanine compound can be used as well.

Green Coloring Agent:

Similarly, examples of green coloring agent include phthalocyanine-type, anthraquinone-type and perylene-type green coloring agents and specifically, for example, Pigment Green 7, Pigment Green 36, Solvent Green 3, Solvent Green 5, Solvent Green 20 and Solvent Green 28 can be used. In addition to the above-described ones, a metal-substituted or unsubstituted phthalocyanine compound can be used as well.

Yellow Coloring Agent:

Examples of yellow coloring agent include monoazo-type, disazo-type, condensed azo-type, benzimidazolone-type, isoindolinone-type and anthraquinone-type yellow coloring agents and specific examples thereof include the followings.

Anthraquinone-type: Solvent Yellow 163, Pigment Yellow 24, Pigment Yellow 108, Pigment Yellow 193, Pigment Yellow 147, Pigment Yellow 199 and Pigment Yellow 202.

Isoindolinone-type: Pigment Yellow 110, Pigment Yellow 109, Pigment Yellow 139, Pigment Yellow 179 and Pigment Yellow 185.

Condensed azo-type: Pigment Yellow 93, Pigment Yellow 94, Pigment Yellow 95, Pigment Yellow 128, Pigment Yellow 155, Pigment Yellow 166 and Pigment Yellow 180.

Benzimidazolone-type: Pigment Yellow 120, Pigment Yellow 151, Pigment Yellow 154, Pigment Yellow 156, Pigment Yellow 175 and Pigment Yellow 181.

Monoazo-type: Pigment Yellow 1, 2, 3, 4, 5, 6, 9, 10, 12, 61, 62, 62:1, 65, 73, 74, 75, 97, 100, 104, 105, 111, 116, 167, 168, 169, 182, 183.

Disazo-type: Pigment Yellow 12, 13, 14, 16, 17, 55, 63, 81, 83, 87, 126, 127, 152, 170, 172, 174, 176, 188, and 198.

In addition to the above, in order to adjust the color tone, for example, a violet, orange, brown and/or black coloring agent(s) may also be added.

Specific examples of such coloring agent include Pigment Violet 19, 23, 29, 32, 36, 38 and 42, Solvent Violet 13 and 36, C.I. Pigment Orange 1, C.I. Pigment Orange 5, C.I. Pigment Orange 13, C.I. Pigment Orange 14, C.I. Pigment Orange 16, C.I. Pigment Orange 17, C.I. Pigment Orange 24, C.I. Pigment Orange 34, C.I. Pigment Orange 36, C.I. Pigment Orange 38, C.I. Pigment Orange 40, C.I. Pigment Orange 43, C.I. Pigment Orange 46, C.I. Pigment Orange 49, C.I. Pigment Orange 51, C.I. Pigment Orange 61, C.I. Pigment Orange 63, C.I. Pigment Orange 64, C.I. Pigment Orange 71, C.I. Pigment Orange 73, C.I. Pigment Brown 23, C.I. Pigment Brown 25, C.I. Pigment Black 1 and C.I. Pigment Black 7.

The above-described coloring agents may be blended as appropriate and the content thereof is preferably not higher than 10% by mass, more preferably 0.05 to 5% by mass, based on the total amount of the composition.

EXAMPLES

The present invention will now be described concretely by way of examples and comparative examples thereof; however, the present invention is not restricted to the following examples by any means. It is noted here that, in the following Examples and Comparative Examples, "part(s)" and "%" are by mass unless otherwise specified.

(Alkali-soluble Resin Synthesis Example 1)

Into an autoclave equipped with a thermometer, a nitrogen and alkylene oxide introduction device and a stirrer, 119.4 parts of a novolac-type cresol resin (trade name "SHONOL CRG951", manufactured by Showa Denko K.K., OH equivalent: 119.4), 1.19 parts of potassium hydroxide and 119.4 parts of toluene were loaded. While stirring the resulting mixture, the atmosphere inside the system was replaced with nitrogen and heated. Then, 63.8 parts of propylene oxide was slowly added dropwise and the resultant was allowed to react for 16 hours at a temperature of 125 to 132° C. and a pressure of 0 to 4.8 kg/cm². Thereafter, the system was cooled to room temperature and 1.56 parts of 89% phosphoric acid was added and mixed with the resulting reaction solution to neutralize potassium hydroxide, thereby obtaining a propylene oxide reaction solution of the novolac-type cresol resin having a non-volatile content of 62.1% and a hydroxyl value of 182.2 g/eq. This indicated that an average of 1.08 mol of propylene oxide was added per 1 equivalent of phenolic hydroxyl group.

Into a reaction vessel equipped with a stirrer, a thermometer and an air blowing tube, 293.0 parts of the thus obtained propylene oxide reaction solution of the novolac-type cresol resin, 43.2 parts of acrylic acid, 11.53 parts of methanesulfonic acid, 0.18 part of methylhydroquinone and 252.9 parts of toluene were loaded. While blowing air into the resulting mixture at a rate of 10 ml/min, the mixture was allowed to react for 12 hours at 110° C. with stirring. By this reaction, 12.6 parts of water was distilled out as an azeotropic mixture with toluene. Thereafter, the resultant was cooled to room temperature and the thus obtained reaction solution was neutralized with 35.35 parts of 15% aqueous sodium hydroxide solution and then washed with water. Subsequently, toluene was replaced with 118.1 parts of diethylene glycol monoethyl ether acetate and distilled out using an evaporator to obtain a novolac-type acrylate resin solution. Next, 332.5 parts of the thus obtained novolac-type acrylate resin solution and 1.22 parts of triphenylphosphine were loaded to a reaction vessel equipped with a stirrer, a thermometer and an air blowing tube. While blowing air to the resulting mixture at a rate of 10 ml/min, 60.8 parts of tetrahydrophthalic anhydride was slowly added with stirring, and the resultant was allowed to react for 6 hours at a temperature of 95 to 101° C. The resulting solution was cooled and then recovered from the reaction vessel. In this manner, a solution of carboxyl group-containing photosensitive resin having a non-volatile content of 65% and a solid acid value of 87.7 mg KOH/g hereinafter, abbreviated as "A-1"was obtained.

(Alkali-Soluble Resin Synthesis Example 2)

Into an autoclave equipped with a thermometer, a nitrogen and alkylene oxide introduction device and a stirrer, 119.4 parts of a novolac-type cresol resin (trade name "SHONOL CRG951", manufactured by Showa Denko K.K., OH equivalent: 119.4), 1.19 parts of potassium hydroxide and 119.4 parts of toluene were loaded. While stirring the resulting mixture, the atmosphere inside the system was replaced with nitrogen and heated. Then, 63.8 parts of propylene oxide was slowly added dropwise and the resultant was allowed to react for 16 hours at a temperature of 125 to 132° C. and a pressure of 0 to 4.8 kg/cm². Thereafter, the system was cooled to room temperature and 1.56 parts of 89% phosphoric acid was added and mixed with the resulting reaction solution to neutralize potassium hydroxide, thereby obtaining a propylene oxide reaction solution of the novolac-type cresol resin having a non-volatile content of 62.1% and a hydroxyl value of 182.2 g/eq. This indicated that an average of 1.08 mol of propylene oxide was added per 1 equivalent of phenolic hydroxyl group.

For 302.6 parts of the thus obtained propylene oxide reaction solution of the novolac-type cresol resin, toluene was replaced with 188.0 parts of diethylene glycol monoethyl ether acetate and distilled out using an evaporator. Then, into a reaction vessel equipped with a stirrer, a thermometer and an air blowing tube, 371.0 parts of the resulting propylene oxide reaction solution of the novolac-type cresol resin and 1.22 parts of triphenylphosphine were loaded. While blowing air to the resulting mixture at a rate of 10 ml/min, 166.0 parts of tetrahydrophthalic anhydride was slowly added with stirring, and the resultant was allowed to react for 6 hours at a temperature of 95 to 101° C. The resulting solution was cooled and then recovered from the reaction vessel. In this manner, a solution of carboxyl group-containing photosensitive resin having a non-volatile content of 65% and a solid acid value of 161 mg KOH/g (hereinafter, abbreviated as "A-2") was obtained.

(Curable Resin Composition Examples 1 to 13)

The respective components shown in Table 1 below were blended at the ratios (parts by mass) shown in Table 1. The resultants were each pre-mixed using a stirrer and then kneaded with a 3-roll mill to prepare the respective curable resin compositions for solder resist.

TABLE 1

| Composition (parts by mass) | | Curable Resin Composition Example | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| Resin | A-1 | 154 | 154 | 154 | | | 154 | 154 | 154 | 154 | | | | |
| | A-2 | | | | 154 | | | | | | 154 | | | |
| | *1 | | | | | 154 | | | | | | 154 | 154 | 154 |
| Acrylate compound | *2 | 20 | 20 | 20 | | | 20 | 20 | 20 | 20 | | | | |
| Cyanate compound | *3 | | | 30 | 30 | 30 | | | | | | | | |
| Epoxy resin | *4 | 15 | 15 | 15 | 15 | 50 | 15 | 15 | 15 | 15 | 15 | 50 | 50 | 50 |
| | *5 | 15 | 15 | 15 | 15 | | 15 | 15 | 15 | 15 | 15 | | | |
| | *6 | | | | | 50 | | | | | | 50 | 50 | 50 |
| Photopolymerization initiator | *7 | 1 | 1 | 1 | 1 | 1 | 1 | 1 | 1 | 1 | 1 | | | |
| Filler | *8 | | 20 | 20 | 20 | 20 | 20 | 20 | 20 | 20 | 20 | 20 | 20 | 20 |
| | *9 | 80 | | 80 | 80 | 80 | 80 | 80 | 80 | 80 | 80 | 80 | 80 | 80 |
| P atom-containing curing accelerator | *10 | 1 | | | | | | | | | | | | 1 |
| | *11 | | 1 | | | | | | | | | | | |
| | *12 | | | 1 | 1 | 1 | | | | | | | | |

TABLE 1-continued

| Composition (parts by mass) | | Curable Resin Composition Example | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| N atom-containing basic compound | *13 | | | | | | | 1 | 2 | 1 | 1 | 1 | 1 | |
| | *14 | | | | | | | 1 | | | | | | |
| | *15 | | | | | | | | | 1 | 1 | 1 | 1 | |

In Table 1, the index numbers mean as follows.
*1: phenol novolac resin (PHENOLITE manufactured by DIC Corporation); solid content = 65%, solvent (propylene glycol monomethyl ether acetate) = 35%
*2: dipentaerythritol hexaacrylate (manufactured by Nippon Kayaku Co., Ltd.)
*3 PT30, manufactured by LONZA Japan
*4: NC-3000 (manufactured by Nippon Kayaku Co., Ltd.); solid content = 60%, solvent (propylene glycol monomethyl ether acetate) = 40%
*5: bixylenol-type epoxy resin (manufactured by Mitsubishi Chemical Corporation)
*6: bisphenol A-type epoxy resin (jER828, manufactured by Mitsubishi Chemical Corporation)
*7: ethanone,1-[9-ethyl-6-(2-methylbenzoyl)-9H-carbazole-1-(O-acetyloxime); IRGACURE OXE02 (manufactured by BASF Japan, Ltd.)
*8: B-30 (barium sulfate, manufactured by Sakai Chemical Industry Co., Ltd.)
*9: SO-E2 (silica, manufactured by Admatechs Co., Ltd.)
*10: tri-p-tolylphosphine
*11: triphenylphosphine
*12: tetraphenylphosphonium tetra-p-methylphenylborate
*13: melamine
*14: 2E4MZ (2-ethyl-4-methylimidazole, manufactured by Shikoku Chemicals Corporation)
*15: 2-vinyl-4,6-diamino-1,3,5-triazine Preparation of Dry Film Examples 1 to 11 and Comparative Examples 1 to 8

Using the above-described Curable Resin Composition Examples 1 to 13 in accordance with the combinations shown in Table 2 below, dry films having a patternable multi-layer structure were prepared. The dry film were prepared by repeating the steps of: applying a curable resin composition onto a 38 μm-thick polyester film, which was used as a carrier film, using an applicator; drying the curable resin composition at 80° C. for 10 minutes; applying another curable resin composition thereon; and again drying the resultant at 80° C. for 10 minutes. It is noted here that the application and drying steps of the curable resin compositions were carried out sequentially, starting with the one which was going to be the outermost layer when viewed from the side of the substrate at the time of laminating the resulting dry film onto the substrate. The layers are sequentially referred to as "L1 layer", "L2 layer" and "L3 layer" from the layer in contact with the film.

FIG. 1 schematically shows a cross-section of a dry film which was prepared in accordance with Examples and Comparative Examples other than Examples 7 and 10. In the dry film shown in FIG. 1, a curable resin layer 3 (L1 layer) and a curable resin layer 2 (L2 layer) are sequentially laminated on a carrier film 4 and a cover film 1 is further laminated on top of the curable resin layer 2 (L2 layer). It is noted here that, in Examples 7 and 10, although not shown in FIG. 1, another curable resin layer (L3 layer) is further laminated on the curable resin layer 2 (L2 layer) and the cover film 1 is laminated on this curable resin layer (L3 layer).

TABLE 2

| Composition Example | Example | | | | | | | | | | |
|---|---|---|---|---|---|---|---|---|---|---|---|
| | 1 | 2 | 3 | 4 | 5 | 6 | 7 | 8 | 9 | 10 | 11 |
| 1 | L2 (15 μm) | L2 (15 μm) | L2 (15 μm) | | | L2 (20 μm) | L3 (10 μm) | | | L3 (10 μm) | |
| 2 | | | | L2 (15 μm) | | | L2 (10 μm) | | | | |
| 3 | | | | | L2 (15 μm) | | | | | | |
| 4 | | | | | | | | L2 (15 μm) | | | |
| 5 | | | | | | | | | L2 (15 μm) | | |
| 6 | | | | | | | | | | L2 (5 μm) | |
| 7 | L1 (5 μm) | | | L1 (5 μm) | L1 (5 μm) | L1 (20 μm) | L1 (10 μm) | | | L1 (5 μm) | |
| 8 | | L1 (5 μm) | | | | | | | | | |
| 9 | | | L1 (5 μm) | | | | | | | | |
| 10 | | | | | | | | L1 (5 μm) | | | |
| 11 | | | | | | | | | L1 (5 μm) | | |

TABLE 2-continued

| | | | | | | | | | L1 (5 μm) |
|---|---|---|---|---|---|---|---|---|---|
| 12 | | | | | | | | | |
| 13 | | | | | | | | | L2 (15 μm) |

| Example | Composition | | | Comparative Example | | | | | |
|---|---|---|---|---|---|---|---|---|---|
| | 1 | 2 | 3 | 4 | 5 | 6 | 7 | 8 |
| 1 | L1 (5 μm) | | | | | L1 (20 μm) | | |
| 2 | | L1 (5 μm) | | | | | | |
| 3 | | | L1 (5 μm) | | | | | |
| 4 | | | | L1 (5 μm) | | | | |
| 5 | | | | | L1 (5 μm) | | | |
| 6 | | | | | | | | |
| 7 | L2 (15 μm) | L2 (15 μm) | L2 (15 μm) | | | L1 (20 μm) | | |
| 8 | | | | | | | | |
| 9 | | | | | | | | |
| 10 | | | | L2 (15 μm) | | | | |
| 11 | | | | | L2 (15 μm) | | | |
| 12 | | | | | | | | L2 (15 μm) |
| 13 | | | | | | | | L1 (5 μm) |

(Optimum Exposure Dose)

Examples 1 to 10 and Comparative Examples 1 to 7

A single-sided printed circuit board having a 15 μm-thick copper circuit formed thereon in advance was prepared and subjected to a pre-treatment using CZ8100 (manufactured by MEC Co., Ltd.). On the resulting circuit board (substrate), the above-described dry films of Examples and Comparative Examples were each laminated using a vacuum laminator such that the L1 layer came into contact with the substrate, thereby forming a curable resin layer having a bilayer or three-layer structure on the substrate. Then, the resulting substrate was exposed through a step tablet (Kodak No. 2) using an exposure apparatus equipped with a high-pressure mercury lamp (short arc lamp) and then developed for 60 seconds (30° C., 0.2 MPa, 1%-by-mass $Na_2CO_3$ aqueous solution). In this process, the exposure dose at which the pattern of the step tablet remained in three tiers was defined as the optimum exposure does, and the dry films of the Examples 1 to 9 and Comparative Examples 1 to 7 were all subjected to the following tests at an exposure dose of 100 mJ/cm².

Characteristic Test

Examples 1 to 10 and Comparative Examples 1 to 7

A single-sided printed circuit board having a 15 μm-thick copper circuit formed thereon in advance was prepared and subjected to a pre-treatment using CZ8100 (manufactured by MEC Co., Ltd.). On the resulting circuit board (substrate), the above-described dry films of Examples and Comparative Examples were each laminated using a vacuum laminator such that the L1 layer came into contact with the substrate, thereby forming a curable resin layer having a layered structure on the substrate. Then, after exposing the resulting substrate to a solder resist pattern at the above-described optimum exposure dose using an exposure apparatus equipped with a high-pressure mercury short arc lamp, the carrier film was detached and the substrate was developed for 60 seconds with 1%-by-mass aqueous sodium carbonate solution at 30° C. at a spray pressure of 0.2 MPa, thereby obtaining a solder resist pattern having an opening diameter of 80 μm. The resulting substrate was irradiated with ultraviolet light at a cumulative exposure dose of 1,000 mJ/cm² in a UV conveyor furnace and then heat-cured at 160° C. for 60 minutes. The characteristics of the thus obtained printed circuit board (evaluation substrate) were evaluated in the following manner.

Characteristic Test

Example 11 and Comparative Example 8

A single-sided printed circuit board having a 15 μm-thick copper circuit formed thereon in advance was prepared and subjected to a pre-treatment using CZ8100 (manufactured by MEC Co., Ltd.). On the resulting circuit board (substrate), the above-described dry films of Example 11 and Comparative Example 8 were each laminated using a vacuum laminator such that the L1 layer came into contact with the substrate, thereby forming a curable resin layer having a layered structure on the substrate. The resulting substrate was then processed with a $CO_2$ laser (10.6 μm) to obtain a solder resist pattern having an opening diameter of 80 μm. Thereafter, in accordance with the following desmear treatment conditions, the thus obtained solder resist pattern was treated with an aqueous permanganate desmear solution (wet method) so as to remove residues.

Desmear Conditions (Rohm and Haas Co.)

| Swelling | MLB-211 | temperature: 80° C./duration: 10 min |
|---|---|---|
| Permanganic acid | MLB-213 | temperature: 80° C./duration: 15 min |
| Reduction | MLB-216 | temperature: 50° C./duration: 5 min |

The characteristics of the thus obtained printed circuit board (evaluation substrate) were evaluated in the following manner.

<Resistance to Electroless Gold Plating>

The evaluation substrates were each plated in a commercially available electroless nickel plating bath and electroless gold plating bath to a nickel thickness of 0.5 μm and a gold thickness of 0.03 μm. After evaluating the presence or absence of infiltration of the plating solution into the solder resist, the presence or absence of detachment of the solder resist was evaluated by performing a tape peeling test. The evaluation criteria were as follows.

o: Infiltration and detachment were not observed.

Δ: A slight infiltration was observed after the plating; however, no detachment was observed after the tape peeling.

x: The resist layer was detached after the tape peeling.

<PCT Resistance>

The evaluation substrates subjected to the above-described electroless gold plating were placed in a high-pressure, high-temperature and high-humidity chamber maintained at a temperature of 121° C., a pressure of 2 atm and a humidity of 100% for 300 hours. Thereafter, the change in the condition of each solder resist was evaluated based on the following criteria.

o: The solder resist did not show any prominent swelling or discoloration.

Δ: No prominent detachment was observed; however, a partial detachment or discoloration was observed.

x: The solder resist showed prominent swelling and discoloration.

<Insulation Reliability>

An evaluation substrate was prepared with a comb-shaped electrode pattern (line/space=50 μm/50 μm) under the above-described conditions to evaluate the insulation reliability (electrode corrosion).

As for the evaluation method, a bias voltage of DC 30V was applied to this comb-shaped electrode under a high-temperature and high-humidity condition of 121° C. and 97% R.H. and the time required for the insulation to be degraded was measured. Here, the insulation was judged to be degraded when the electrical resistance value became less than $1 \times 10^{-6} \Omega$.

The evaluation criteria were as follows.

o: The time required for the insulation to be degraded was longer than 200 hours.

Δ: The time required for the insulation to be degraded was 100 hours to 200 hours.

x: The time required for the insulation to be degraded was less than 100 hours.

TABLE 3

| Characteristic | Example | | | | | | | | | | | Comparative Example | | | | | | | |
|---|---|---|---|---|---|---|---|---|---|---|---|---|---|---|---|---|---|---|---|
| Test | 1 | 2 | 3 | 4 | 5 | 6 | 7 | 8 | 9 | 10 | 11 | 1 | 2 | 3 | 4 | 5 | 6 | 7 | 8 |
| Resistance to Electroless Gold Plating | o | o | o | o | o | o | o | o | o | o | o | x | x | x | x | x | x | o | x |
| PCT Resistance | o | o | o | o | o | o | o | o | o | o | o | x | x | x | x | x | x | o | x |
| Insulation reliability | o | o | o | o | o | o | o | o | o | o | o | x | x | x | x | x | o | x | x |

As shown in Table 3, it was confirmed that the dry films of Examples 1 to 11 can yield a laminated structure having both insulation reliability and adhesive property. This is believed to be because the resin insulating layer in contact with the substrate surface exerted adhesiveness to the substrate by containing an N atom-containing basic compound. Further, in addition to the resin insulating layer containing a curing accelerator composed of an N atom-containing basic compound, the dry films of Examples 1 to 11 also have at least one resin insulating layer which contains a P atom-containing curing accelerator. Accordingly, it is believed that the insulation reliability was improved because of the resin insulating layer which contains a P atom-containing curing accelerator.

DESCRIPTION OF SYMBOLS

1: Cover film
2: Curable resin layer (L2 layer)
3: Curable resin layer (L1 layer)
4: Carrier film

The invention claimed is:

1. A laminated structure, comprising:
a printed circuit board having a conductor circuit layer; and
a solder resist layer having a pattern and formed on the printed circuit board, the solder resist layer comprising a plurality of resin insulating layers including a first resin insulating layer and at least one second resin insulating layer such that the first resin insulating layer is formed in contact with the conductor circuit layer of the printed circuit board,
wherein the first resin insulating layer is formed from a photocurable and thermosetting alkali developing resin composition which comprises a photopolymerization initiator, a carboxyl group-containing resin, a thermosetting component, and a curing accelerator composed of an N atom-containing basic compound and comprises substantially no P atom-containing curing accelerator, the second resin insulating layer is formed from a photocurable and thermosetting alkali developing resin composition comprising a photopolymerization initiator, a carboxyl group-containing resin, a thermosetting component, and a P atom-containing curing accelerator and comprising substantially no curing accelerator composed of an N atom-containing basic compound, the curing accelerator composed of the N atom-containing basic compound of the first resin insulating layer comprises at least one of dicyandiamide, melamine, imidazole, benzimidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, benzyldimethylamine, 4-(dimethylamino)-N,N-dimethylbenzylamine, 4-methoxy-N,N-dimethylbenzylamine, 4-methyl-N,N-dimethylbenzylamine, benzoxazole, benzothiazole, benzotriazole and 2-vinyl-4,6-diamino-1,3,5-triazine, and the P atom-containing curing accelerator of the second resin insulating layer comprises at least one of triphenylphosphine, tri-p-tolylphosphine, tri-o-tolylphosphine, tri-m-tolylphosphine, tri-2,4-xylylphosphine, tetraphosphonium tetraphenylborate, tetraphenylphosphonium tetra-p-methylphenylborate, tetraphenylphosphonium thiocyanate, and tetrabutylphosphonium decanoate.

2. The laminated structure according to claim 1, wherein a surface layer of the plurality of resin insulating layers is the second resin insulating layer.

3. The laminated structure according to claim 1, wherein the plurality of resin insulating layers consists of the first resin insulating layer and the second resin insulating layer.

4. The laminated structure according to claim 1, wherein the P atom-containing curing accelerator in the second resin insulating layer comprises at least one of tetraphosphonium tetraphenylborate, tetraphenylphosphonium tetra-p-methylphenylborate, tetraphenylphosphonium thiocyanate, and tetrabutylphosphonium decanoate.

5. A dry film, comprising:
a film; and
a plurality of curable resin layers formed on the film and comprising a first curable resin layer and at least one second curable resin layer such that the first curable resin layer is formed in contact with the film or forming an outermost layer of the curable resin layers,
wherein the first curable resin layer comprises a photopolymerization initiator, a carboxyl group-containing resin, a thermosetting component, and a curing accelerator composed of an N atom-containing basic compound such that the first curable resin layer is photocurable and thermosetting, and comprises substantially no P atom-containing curing accelerator, the second curable resin layer comprises a photopolymerization initiator, a carboxyl group-containing resin, a thermosetting component, and a P atom-containing curing accelerator such that the second curable resin layer is photocurable and thermosetting, and comprises substantially no curing accelerator composed of an N atom-containing basic compound, the photopolymerization initiator in the first and second curable resin layers is selected from the group consisting of an oxime ester-based photopolymerization initiator having an oxime ester group, an alkylphenone-based photopolymerization initiator, an α-aminoacetophenone-based photopolymerization initiator, an acylphosphine oxide-based photopolymerization initiator and a titanocene-based photopolymerization initiator, the curing accelerator composed of the N atom-containing basic compound comprises at least one of dicyandiamide, melamine, imidazole, benzimidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, benzyldimethylamine, 4-(dimethylamino)-N,N-dimethylbenzylamine, 4-methoxy-N,N-dimethylbenzylamine, 4-methyl-N,N-dimethylbenzylamine, benzoxazole, benzothiazole, benzotriazole and 2-vinyl-4,6-diamino-1,3,5-triazine, and the P atom-containing curing accelerator comprises at least one of triphenylphosphine, tri-p-tolylphosphine, tri-o-tolylphosphine, tri-m-tolylphosphine, tri-2,4-xylylphosphine, tetraphosphonium tetraphenylborate, tetraphenylphosphonium tetra-p-methylphenylborate, tetraphenylphosphonium thiocyanate, and tetrabutylphosphonium decanoate.

6. The dry film according to claim 5, wherein a surface layer of the plurality of curable resin layers is the second curable resin layer.

7. The dry film according to claim 5, wherein the plurality of curable resin layers consists of the first curable resin layer and the second curable resin layer.

8. The dry film according to claim 7, wherein each of the first curable resin layer and the second curable resin layer has a thickness in a range of from 1 to 50 μm.

9. The laminated structure according to claim 1, wherein the P atom-containing curing accelerator in the second resin insulating layer comprises at least one of tri-p-tolylphosphine, triphenylphosphine and tetraphenylphosphonium tetra-p-methylphenylborate.

10. The laminated structure according to claim 1, wherein the P atom-containing curing accelerator in the second resin insulating layer comprises tetraphenylphosphonium tetra-p-methylphenylborate.

11. The laminated structure according to claim 1, wherein the N atom-containing basic compound in the first resin insulating layer comprises at least one of melamine, 2-ethyl-4-methylimidazole and 2-vinyl-4,6-diamino-1,3,5-triazine.

12. The laminated structure according to claim 1, wherein the N atom-containing basic compound in the first resin insulating layer comprises at least one of melamine, 2-ethyl-4-methylimidazole and 2-vinyl-4,6-diamino-1,3,5-triazine, and the P atom-containing curing accelerator in the second resin insulating layer comprises at least one of tri-p-tolylphosphine, triphenylphosphine and tetraphenylphosphonium tetra-p-methylphenylborate.

13. The laminated structure according to claim 12, wherein each of the first resin insulating layer and the second resin insulating layer has a thickness in a range of from 1 to 50 μm.

14. The laminated structure according to claim 1, wherein the photopolymerization initiator in the photocurable and thermosetting alkali developing resin composition forming the first and second resin insulating layers is selected from the group consisting of an oxime ester-based photopolymerization initiator having an oxime ester group, an alkylphenone-based photopolymerization initiator, an α-aminoacetophenone-based photopolymerization initiator, an acylphosphine oxide-based photopolymerization initiator and a titanocene-based photopolymerization initiator.

15. The laminated structure according to claim 1, wherein the thermosetting component in the photocurable and thermosetting alkali developing resin composition forming the first and second resin insulating layers is selected from the group consisting of a melamine resin, a benzoguanamine resin, a melamine derivative, a benzoguanamine derivative, a blocked isocyanate compound, a cyclocarbonate compound, a polyfunctional epoxy compound, a polyfunctional oxetane compound, an episulfide resin, a bismaleimide and a carbodiimide resin.

16. The dry film according to claim 5, wherein the thermosetting component in the first and second curable resin layers is selected from the group consisting of a melamine resin, a benzoguanamine resin, a melamine derivative, a benzoguanamine derivative, a blocked isocyanate compound, a cyclocarbonate compound, a polyfunctional epoxy compound, a polyfunctional oxetane compound, an episulfide resin, a bismaleimide and a carbodiimide resin.

17. A method of producing a laminated structure, comprising:

laminating the dry film according to claim 5 on a base material such that the first curable resin layer comes into contact with the base material.

\* \* \* \* \*